US006838675B2

(12) United States Patent
Harada et al.

(10) Patent No.: US 6,838,675 B2
(45) Date of Patent: Jan. 4, 2005

(54) SPECIMEN OBSERVATION SYSTEM FOR APPLYING EXTERNAL MAGNETIC FIELD

(75) Inventors: Ken Harada, Fuchu (JP); Junji Endo, Sakado (JP); Nobuyuki Osakabe, Kawagoe (JP)

(73) Assignees: Hitachi, Ltd., Tokyo (JP); Japan Science and Technology Agency, Saitama (JP)

( * ) Notice: Subject to any disclaimer, the term of this patent is extended or adjusted under 35 U.S.C. 154(b) by 0 days.

(21) Appl. No.: 10/450,614

(22) PCT Filed: Jan. 18, 2002

(86) PCT No.: PCT/JP02/00324

§ 371 (c)(1),
(2), (4) Date: Jun. 17, 2003

(87) PCT Pub. No.: WO02/080218

PCT Pub. Date: Oct. 10, 2002

(65) Prior Publication Data

US 2004/0061066 A1 Apr. 1, 2004

(30) Foreign Application Priority Data

Mar. 28, 2001 (JP) ......................................... 2001-097343

(51) Int. Cl.$^7$ .................................................. H01J 3/14

(52) U.S. Cl. .............................. 250/396 ML; 250/311; 250/307

(58) Field of Search ......................... 250/396 ML, 307, 250/311

(56) References Cited

FOREIGN PATENT DOCUMENTS

| JP | 8-264146 | | 3/1995 |
|----|----------|---|--------|
| JP | 08-264146 | * | 11/1996 |
| JP | 08-096737 | * | 12/1996 |

OTHER PUBLICATIONS

Sir P. Hirasch et al., "Electron Microscopy of Thin Crystals", (1965) Robert E. Krieger Publishing Co., Inc., Chapter 16.4, pp. 388–401.

Kohei Shirota, Akira Yonezawa, Kunio Shibatomi and Takashi Yanaka, "Ferro–Magnetic Material Observation Lens System for CTEM with a Eucentric Goniometer", J. Electron Microsc., vol. 25, No. 4 (1976), pp. 303–304.

J.N. Chapman, A.B. Johnston, L.J. Heyderman, S. McVitie and W.A.P. Nicholson, "Coherent Magnetic Imaging by TEM", IEEE Transactions on Magnetics, vol. 30. No. 6 (1994), 4479–4484.

(List continued on next page.)

Primary Examiner—John R. Lee
Assistant Examiner—James J. Leybourne
(74) Attorney, Agent, or Firm—Reed Smith LLP; Stanley P. Fisher, Esq.; Juan Carlos A. Marquez, Esq.

(57) ABSTRACT

To prevent the displacement from an optical axis of a charged particle beam from being made independent of the direction (parallel to or perpendicular to the optical axis) of a magnetic field applied to a specimen, a system including an electron microscope and using a charged particle beam optical system is provided with a source of a charged particle beam, a condenser optical system, a specimen to be observed, a system for applying a magnetic field to the specimen, an imaging optical system and an image observation/recording apparatus, is provided with first and second charged particle beam deflection systems in order along a direction in which the charged particle beam travels between the condenser optical system and the specimen, is provided with third and fourth charged particle beam deflection systems in order between the specimen and the imaging lens system, and the quantity and the direction of the deflection of the charged particle beam by each deflection system and the intensity and the bearing of a magnetic field applied to the specimen are related according to predetermined relation.

25 Claims, 18 Drawing Sheets

OTHER PUBLICATIONS

Jun Chen, Tsukasa Hirayama, Guanming Lai, Takayoshi Tanji, Kazuo Ishizuka and Akira Tonomura, "Video–Rate Electron–Holographic Interference Microscopy Using a Liquid–Crystal Panel", Optical Review, vol. 1, No. 2 (1994), pp. 304–307.

T. Yoshida, J. Endo, K. Harada, H. Kasai, T. Matsuda, O. Kamimura, A. Tonomura, M. Beleggia, R. Patti and G. Pozzi, "Foucault Imaging of Superconducting Fluxons", Journal of Applied Physics, vol. 85, No. 8 (Apr. 15, 1999), pp. 4096–4103.

Shuji Hasegawa, Tsuyoshi Matsuda, Junji Endo, Nobuyuki Osakabe, Masukazu Igarashi, Toshio Kobayashi, Masayoshi Naito, Akira Tonomura and Ryozo Aoki, "Magnetic–Flux Quanta in Superconducting Thin Films Observed by Electron Holography and Digital Phase Analysis", Physical Review B, vol. 43, No. 10 (Apr. 1, 1991), pp. 7631–7650.

T. Hirayama, J. Chen, T. Tanji and A. Tonomura, "Dynamic Observation of Magnetic Doamins by On–Line Real–Time Electron Holography", Ultramicroscopy, vol. 54 (1994), pp. 9–14.

Ken Harada, Hiroto Kasai, Tsuyoshi Matsuda, Masami Yamasaki, John E. Bonevich and Akira Tonomura, "Real–Time Observation of the Interaction Between Flux Lines and Defects in a Superconductor by Lorentz Microscopy", Jpn. J. Appl. Phys., vol. 33 (1994), pp. 2534–2540.

A. Tonomura, "Electron Holography", Springer Series in Optical Science, vol; 70, (1993), pp. 74–93.

K. Harada, T. Matsuda, J. Bonevich, M. Igarashi, S. Kondo, G. Pozzi, U. Kawabe and A. Tonomura, "Real–time Observation of Vortex Lattices in a Superconductor by Electron Microscopy", Nature, vol. 360 (Nov. 5, 1992), pp. 51–53.

R. Aoki, U. Krageloh, T. Miyazaki and B. Shinozaki, "Interphase Surface Energy Parameter of Superconducting Lead in the Temperature Range from 4.7 K to 7.1 K", Phys. Letters, vol. 45–A, No. 2 (Sep. 10, 1973), pp. 89–90.

* cited by examiner

FIG. 18

| | magnetic field | number of turns | noise |
|---|---|---|---|
| 211 — 010 | $BD_1$ | N | $\delta\alpha$ |
| 221 — 020 | $BD_2$ | 2N | $-2\delta\alpha$ |
| 201 — 000 | $BD_0$ | 2N | $2\delta\alpha$ |
| 231 — 030 | $BD_3$ | 2N | $-2\delta\alpha$ |
| 241 — 040 | $BD_4$ | N | $\delta\alpha$ |

FIG. 19

| | magnetic field | number of turns | noise |
|---|---|---|---|
| 215 → 010 | $BD_1$ | N | $\delta\alpha$ |
| 020 | $BD_2$ | 2N | $-2\delta\alpha$ |
| 227 | $BD_{2a}$ | 1/4N | $1/4\delta\alpha$ |
| 201 → 000 | $BD_0$ | 2N | $2\delta\alpha$ |
| 237 | $BD_{3a}$ | 1/4N | $1/4\delta\alpha$ |
| 235 → 030 | $BD_3$ | 2N | $-2\delta\alpha$ |
| 040 | $BD_4$ | N | $\delta\alpha$ |

# SPECIMEN OBSERVATION SYSTEM FOR APPLYING EXTERNAL MAGNETIC FIELD

FIELD OF THE INVENTION

The present invention relates to a specimen observation system for applying an external magnetic field having a magnetic field applying element suitable in case a magnetic field of arbitrary magnitude in an arbitrary direction is applied to a specimen to be observed or to be processed in an electron microscope or in a system having an optical system using a charged particle beam.

BACKGROUND OF THE INVENTION

A magnetic lens is often used for a charged particle beam optical system to converge a charged particle beam and at that time, the optical axis of a charged particle beam is arranged so that it is coincident with the principal axis of the magnetic lens. Besides, to enhance the resolution of observation and the precision of processing, the diameter of a charged particle beam is required to be reduced. Therefore, a specimen is often arranged in the vicinity of a center position of a magnetic field generated by the magnetic lens. Above all, in a transmission electron microscope, to acquire an image having little optical aberration and an image of high magnification, a specimen is often arranged in a strong magnetic field (1.5 to 2 T (tesla)) of a magnetic lens. In the meantime, to apply a magnetic field to a specimen and observe the magnetic property of the specimen, it is important to reduce an effect by a magnetic lens.

Therefore, as disclosed in a document (Sir P. Hirasch et al., "Electron Microscopy of Thin Crystals", (1965) Robert E. Krieger Publishing Co., Inc.; Chapter 16.4), a method of turning off a magnetic field of a magnetic lens or a method of locating a specimen apart enough from a magnetic field of a magnetic lens is taken. Further, as disclosed in a paper (K. Shirota et al., J. Electron Microsc., Vol. 25 (1976) FIG. 1) and a paper (J. N. Chapman et al., IEEE Transactions on Magnetics, Vol. 60 (1994) 4479), a magnetic shielding lens in which a magnetic field is hardly applied to a specimen for locating the specimen off a magnetic circuit by a magnetic lens is developed.

In case a determined strong magnetic field is applied to a specimen in parallel with an optical axis, that is, in case a strong longitudinal magnetic field is applied to the specimen, the normal arrangement of a specimen and a method of using a magnetic lens may be used. To apply a weak magnetic field, a method of using a magnetic lens in an extremely weak excited state is taken as disclosed in a document (J. Chen et al., Optical Review Vol. 1 (1994) 304; p. 305 FIG. 3) and a method of using a magnetic field applying coil having an axis parallel to an optical axis is taken as disclosed in a document (T. Yoshida et al., J. Appl. Phys., Vol. 85 (1999) 4096; p. 4098 FIG. 3). A weak magnetic field parallel to an optical axis acts as a weak lens and the slight effect of rotation by Lorentz force upon a charged particle beam is produced, however, the quantity of displacement by rotation from the optical axis of a charged particle beam is small and can be fully corrected by a deflecting optical system with a normal charged particle beam optical system is provided beforehand.

In the meantime, in case a magnetic field is applied to a specimen perpendicularly to an optical axis, that is, in case a transverse magnetic field is applied to the specimen, Lorentz force that acts on a charged particle beam by the transverse magnetic field acts so that the charged particle beam is deflected from its optical axis. Therefore, normally, as disclosed in a paper (S. Hasegawa et al., Phys. Rev. B43 (1991) 7631; p. 7635 FIG. 5) or in Japanese published unexamined patent application No. Hei8-264146, in a system provided with a two-step beam deflector except a coil system for applying a magnetic field to a specimen, a charged particle beam is deflected again so that the charged particle beam travels along the optical axis of a lens system located at the back of the specimen. As a result, the deflection from the optical axis of the charged particle beam by Lorentz force that acts upon the charged particle beam is compensated and a transverse magnetic field is applied to the specimen.

FIG. 1 schematically shows an example in which a general three-step external magnetic field application-type beam deflector are arranged at an equal interval and symmetrical deflection is made. As shown in FIG. 1, a reference number 900 denotes an optical axis. A reference number 910 denotes the trajectory of a charged particle beam and the charged particle beam travels on the optical axis 900. Reference numbers $070_1$ and $070_2$ denote a pair of magnetic field applying coils and they generate a magnetic field B in a direction shown by an arrow in FIG. 1. For a magnetic field, constant field approximation (CFA) is used and a magnetic field region is dotted. The charged particle beam is deflected by the magnetic field. Reference numbers $080_1$ and $080_2$ denote a pair of magnetic field applying coils and they generate a magnetic field 2B in a direction shown by an arrow in FIG. 1. The charged particle beam is deflected in a direction reverse to the deflection by the magnetic field applying coils $070_1$ and $070_2$ by the magnetic field. Reference numbers $090_1$ and $090_2$ denote a pair of magnetic field applying coils and they generate the magnetic field B in the direction shown by an arrow in FIG. 1. The charged particle beam is deflected in a direction reverse to the deflection by the magnetic field applying coils $080_1$ and $080_2$ by the magnetic field and as a result, as shown in FIG. 1, is returned on the optical axis.

In FIG. 1, for convenience sake of construction, the charged particle beam is drawn so that it is deflected in the direction of the applied magnetic field, however, deflection actually caused by Lorentz force is made in a direction perpendicular to page space differently by 90 degrees from the direction of the applied magnetic field. The orientation depends upon charge which a particle has. In the case of an electron microscope, first, a charged particle beam is deflected in a direction toward the back of page space and next, is deflected in a direction toward the surface of the page space. At this time, assuming that for an angle deflected in order from the upside, a first angle is α, an angle of deflection has only to be adjusted so that a second angle is −2α (in a reverse direction) and a third angle is α and assuming that for a magnetic field (magnetic flux density) applied to each system, a magnetic field applied to a first system is B, a magnetic field applied to a second system is −2B and that applied to a third system is B. The two-step beam deflector used for deflection for returning is not necessarily required to be a magnetic field application type and may be also an electric field application type.

FIG. 2 shows another example showing a conventional type three-step external magnetic field application-type beam deflector. The example is different from the example shown in FIG. 1 in that to double the deflection angle of a second step (the center) because the magnetic field intensity of three steps is respectively B, −B, B and is equalized, the length on an optical axis of the corresponding magnetic field region in the deflection system is double, compared with that of upper and lower magnetic field regions, however, the examples are not substantially different in the effect of the deflection of a charged particle beam (assuming that the effect in a first step is α, the effect in a second step is −2α (in a reverse direction) and the effect in a third step is a). Also in FIG. 2, a displayed direction of deflection is different from an actual direction of deflection by 90 degrees as in FIG. 1.

A method of varying a component in a plane of a specimen of a magnetic field effectively applied to the specimen and a component in a normal direction of the plane by arranging the specimen in a magnetic field by a magnetic lens and changing the inclination of the specimen is also taken (for example, refer to a paper (T. Hirayama et al., Ultramicroscopy Vol. 54 (1994) 9; p. 11 FIG. 3). This method is convenient in that no deflection system for applying an external magnetic field to a specimen is used. However, as an angle between a charged particle beam and a specimen varies every condition for applying a magnetic field and a degree of the undersizing of an image by the inclination of the specimen also varies every time, the setting of a condition according to the object of observation is very difficult. Particularly, the method cannot be used for a case that the crystal orientation of a specimen and a direction in which an electron beam is incident are required to be strictly defined such as the observation of a crystal lattice using a high-resolution electron microscope.

SUMMARY OF THE INVENTION

In a specimen observation system for applying an external magnetic field using a charged particle beam optical system including an electron microscope, as described above, it is regular to observe in a state specified so that a predetermined condition is met using an individual system according to a direction (a longitudinal magnetic field parallel to an optical axis or a transverse magnetic field perpendicular to the optical axis) of a magnetic field applied to a specimen. However, in this case, observation in a state in which a magnetic field of arbitrary magnitude in an arbitrary direction is applied to the specimen to be observed or to be processed is impossible. The cause is that three directions of (1) a direction of the optical axis of an optical system for a charged particle beam, (2) the crystal orientation of the specimen or a direction determined by the outline and (3) a direction of a magnetic field applied to the specimen cannot be arbitrarily dealt and is in the structure where a degree of freedom for an orientation in which the magnetic field is applied to the specimen lacks and no consideration is given to the displacement from the optical axis of the charged particle beam deflected by the magnetic field applied to the specimen.

First, referring to FIGS. 1 and 2, the displacement from an optical axis of a charged particle beam deflected by the application of a transverse magnetic field to a specimen will be described.

FIGS. 1 and 2 show a three-step magnetic field application-type beam deflector in case the transverse magnetic field is applied to the specimen as described above. A magnetic field region is dotted and for a position of the specimen, three planes of a plane including a point $S_1$, parallel to the magnetic field and perpendicular to page space, a plane including a point $S_2$, parallel to the magnetic field and perpendicular to the page space and a plane including a point $S_3$, parallel to the magnetic field and perpendicular to the page space are conceivable. Here, description will be made on the supposition that the specimen is arranged on the plane including the point $S_1$, parallel to the magnetic field and perpendicular to the page space. To simplify representation, the plane on which the specimen is arranged is represented as the point $S_1$, $S_2$ or $S_3$.

A charged particle beam 910 radiated from a condenser optical system (not shown) along an optical axis 900 reaches a point $S_0$, however, the charged particle beam is rotated and is deflected by Lorentz force received from a magnetic field also distributed in front of the specimen (between the point $S_0$ and the point $S_1$) located at the point $S_1$. That is, a charged particle is rotated with the optical axis as a tangential line and bends in a direction in which the beam is apart from the optical axis. Therefore, both a position and an angle in/at which the charged particle beam is radiated are different at the point $S_1$ on the plane including the specimen, compared with those in case there is no magnetic field. The displacement is not a problem in an experiment in which a weak magnetic field is applied or in case an incident angle is not important, however, generally, when a crystalline specimen is observed, the displacement has an effect upon an observed image as an interference fringe of an equal inclination. This difficulty is caused by a fact that a magnetic field exists in a state in which it spreads in space and is distributed in front of and at the back of the specimen. That is, the incident beam is inclined in a part in front of the specimen of the magnetic field applied to the specimen and the outgoing beam is further inclined by the magnetic field at the back of the specimen. That is, the beam departs from the optical axis. Therefore, even if the specimen is located at the point $S_3$, the problem is not solved, and a position and an angle in/at which the charged particle beam is incident on the specimen both vary.

The quantity of deflection in the case of an electron beam (acceleration voltage 1 MV) is estimated based upon CFA. If the length of an applied magnetic field region in a direction in which the charged particle beam travels is 20 mm and transverse magnetic field intensity is 20 mT (millitesla), the quantity and the angle of the displacement of the charged particle beam at the point $S_1$ or $S_3$ are 420 μm and 4.2×10$^{-2}$ rad (=2.4°). Generally, the spot diameter of an electron beam is at most approximately 100 μm and the quantity of the displacement described above hinders observation. Further, as the angle of diffraction in Bragg reflection which an electron beam receives from crystalline structure is approximately 1° in case the specimen is a crystal, the variation of the angle described above is a large value that varies a condition of an experiment in case the crystalline specimen is observed. That is, any correction is required.

As the charged particle beam is deflected so that the deflection by the first-step magnetic field is returned by the second-step magnetic field in case the specimen is arranged at the point $S_2$, the charged particle beam is parallel to the optical axis. However, as the position of transit (that is, distance from the optical axis) is different even if the charged particle beam is parallel to the optical axis when the deflection angle α varies according to the intensity of the magnetic field applied to the deflection system as known from FIGS. 1 and 2, a position of observation or processing is required to be changed according to the intensity of the magnetic field applied to the deflection system.

In case the specimen is located at the point $S_0$ or at the point $S_4$ shown in FIGS. 1 and 2, the angle and the position of the radiated charged particle beam are both coincident with the optical axis in a range of CFA. However, in this case, a magnetic field applied to the specimen is effectively zero and the object is not achieved. That is, in case the magnetic field is applied to the specimen using the transverse magnetic field and the deflection system for returning in a horizontal direction using the transverse magnetic field is configured, it is considered that the problem that the radiated position and the direction of the charged particle beam are displaced is caused by the structure and cannot be avoided and heretofore, there was no system that could simultaneously correct the position and the direction of a charged particle beam.

In the invention, in view of the description, a method of not only enabling the application of a magnetic field to a specimen in an arbitrary direction but solving noncomformance caused at that time with the optical axis of a charged particle beam optical system and making a charged particle beam incident on the specimen parallel to the optical axis and on the optical axis and a system for executing the method are proposed.

In the invention, to solve the problem, a charged particle beam radiated along its optical axis from a condenser optical system is deflected by an amount of deflection caused by a front half of a magnetic field applied to a specimen in a reverse direction by a magnetic field by a front beam deflector beforehand and when the charged particle beam is incident on the specimen, both amounts of deflection are compensated and the charged particle beam is incident along the optical axis. When the charged particle beam is outgoing from the specimen, it is deflected by an amount of deflection caused by an end half of the magnetic field applied to the specimen in a reverse direction by a magnetic field by a rear beam deflector, is returned to the optical axis and is made incident on an/a imaging/magnifying lens system. That is, the system according to the invention is configured by a beam deflection system for returning the charged particle beam after the charged particle beam is deflected perpendicularly to the optical axis in front of the specimen and returning it after the returned charged particle beam is deflected perpendicularly to the optical axis again at the back of the specimen.

As described above referring to FIGS. 1 and 2, at the points $S_0$ and $S_4$, the charged particle beam is coincident with the optical axis in both an angle and a radiated position. At the point $S_2$, the charged particle beam is not coincident with the optical axis, however, it passes the point in parallel with the optical axis. Then, when a specimen is located at the point $S_4$, a magnetic field applied to the specimen is made to exist here and the same beam deflection system for deflecting the charged particle beam again as that described in relation to FIGS. 1 and 2 is located at the back of the point $S_4$, the charged particle beam incident on the specimen in coincidence with the optical axis can be produced. That is, in front of and at the back of the specimen, the similar beam deflection system for deflecting the charged particle beam again to that described in relation to FIGS. 1 and 2 has only to be provided. The displacement from the optical axis of the charged particle beam incident on the specimen is corrected by the front beam deflector for deflecting the charged particle beam again, the displacement from the optical axis of the charged particle beam outgoing from the specimen is corrected by the rear beam deflector for deflecting the charged particle beam again, the charged particle beam is returned to the optical axis and is made incident on the imaging/magnifying lens system.

Therefore, according to the invention, even if any magnetic field exists in a position in which a specimen is located, a charged particle beam incident on the specimen is on an optical axis as long as an amount of deflection by the magnetic field is considered. If the amount of deflection in front of a specimen and the amount of deflection at the back of the specimen are controlled corresponding to a change when the intensity of a magnetic field in the position in which the specimen is located is changed, the charged particle beam incident on the specimen can be kept on the optical axis.

BRIEF DESCRIPTION OF THE DRAWINGS

FIG. 18 shows an example of a method of connecting power supplies and beam deflection systems in case the independent power supplies are used to evaluate the effect of noise upon a charged particle beam; and FIG. 19 shows an example of a method of connecting power supplies and beam deflection systems in case first and second beam deflection systems share a power supply and third and fourth beam deflection systems share a power supply to evaluate the effect of noise upon a charged particle beam.

DESCRIPTION OF THE PREFERRED EMBODIMENT

Figure 3:
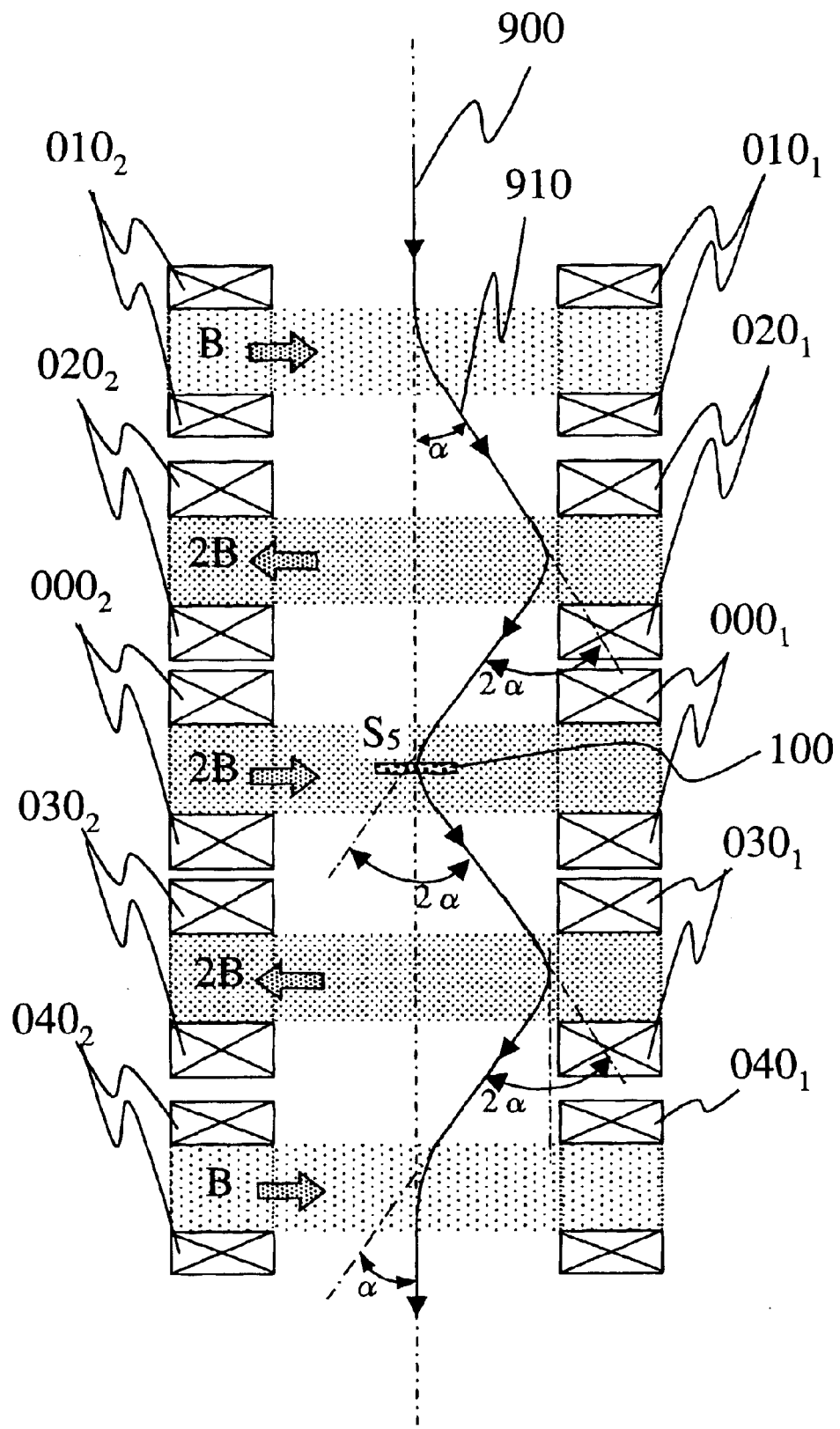
FIG. 3 shows the basic configuration of beam deflection systems according to the invention.

FIG. 3 shows the basic configuration of a beam deflection system according to the invention. In this configuration, a specimen position corresponding to the point $S_4$ described above is shown by a point $S_5$. To simplify the description, only a transverse magnetic field is set as a magnetic field that acts upon a charged particle beam.

As shown in FIG. 3, reference numbers 900 and 910 denote an optical axis and a trajectory of a charged particle beam. Reference numbers $\mathbf{010_1}$ and $\mathbf{010_2}$ denote a pair of magnetic field applying coils and they generate a magnetic field B (a transverse magnetic field) in a direction shown by an arrow in FIG. 3. Reference numbers $\mathbf{020_1}$ and $\mathbf{020_2}$ similarly denote a pair of magnetic field applying coils and they also generate a magnetic field 2B (a transverse magnetic field) in a direction shown by an arrow in FIG. 3. It is similar to the description in relation to FIG. 1 that the trajectory of the charged particle beam 910 is deflected by an angle $\alpha$ by these two pairs of magnetic fields and next, is deflected again by an angle $2\alpha$. A system in which the magnetic field is applied by a pair of magnetic field applying coils $\mathbf{010_1}$ and $\mathbf{010_2}$ is called a first beam deflection system for convenience and a system in which the magnetic field is applied by a pair of magnetic field applying coils $\mathbf{020_1}$ and $\mathbf{020_2}$ is called a second beam deflection system for convenience.

Reference numbers $\mathbf{000_1}$ and $\mathbf{000_2}$ denote a pair of magnetic field applying coils and they generate a magnetic field 2B (a transverse magnetic field) in a direction shown by an arrow in FIG. 3. The center position of the magnetic field corresponds to the point $S_4$ described in relation to FIG. 1, however, in the invention, the center position is denoted as a point $S_5$ and is also a position of a specimen. A system in which a magnetic field is applied by a pair of magnetic field applying coils $\mathbf{000_1}$ and $\mathbf{000_2}$ is called an external magnetic field application system for a specimen for convenience. The external magnetic field application system for a specimen can apply a magnetic field in all three-dimensional directions to a specimen arranged at the point $S_5$ as described later, however, as only the deflection of a charged particle beam and compensation for the displacement as a result of the charged particle beam from the optical axis are described here, the magnetic field is shown as a magnetic field in the same one-directional direction as that in other beam deflection systems. In this position, the trajectory of the charged particle beam is deflected by the angle $2\alpha$ as shown in FIG. 3.

Reference numbers $\mathbf{030_1}$ and $\mathbf{030_2}$ denote a pair of magnetic field applying coils and they generate the magnetic field 2B (the transverse magnetic field) in the direction shown by an arrow in FIG. 3. Reference numbers $\mathbf{040_1}$ and $\mathbf{040_2}$ similarly denote a pair of magnetic field applying coils and they generate the magnetic field B (the transverse magnetic field) in the direction shown by an arrow in FIG. 3. The charged particle beam 910 is returned to the optical axis 900 by deflecting the charged particle beam 910 that passes the point $S_5$ equivalent to the position of the specimen by the angle $2\alpha$ again and reflecting it by the angle $\alpha$ respectively by these two pairs of magnetic fields. A system in which the magnetic field is applied by a pair of magnetic field applying coils $\mathbf{030_1}$ and $\mathbf{030_2}$ is called a third beam deflection system for convenience and a system in which the magnetic field is applied by a pair of magnetic field applying coils $\mathbf{040_1}$ and $\mathbf{040_2}$ is called a fourth beam deflection system for convenience.

Figure 1:
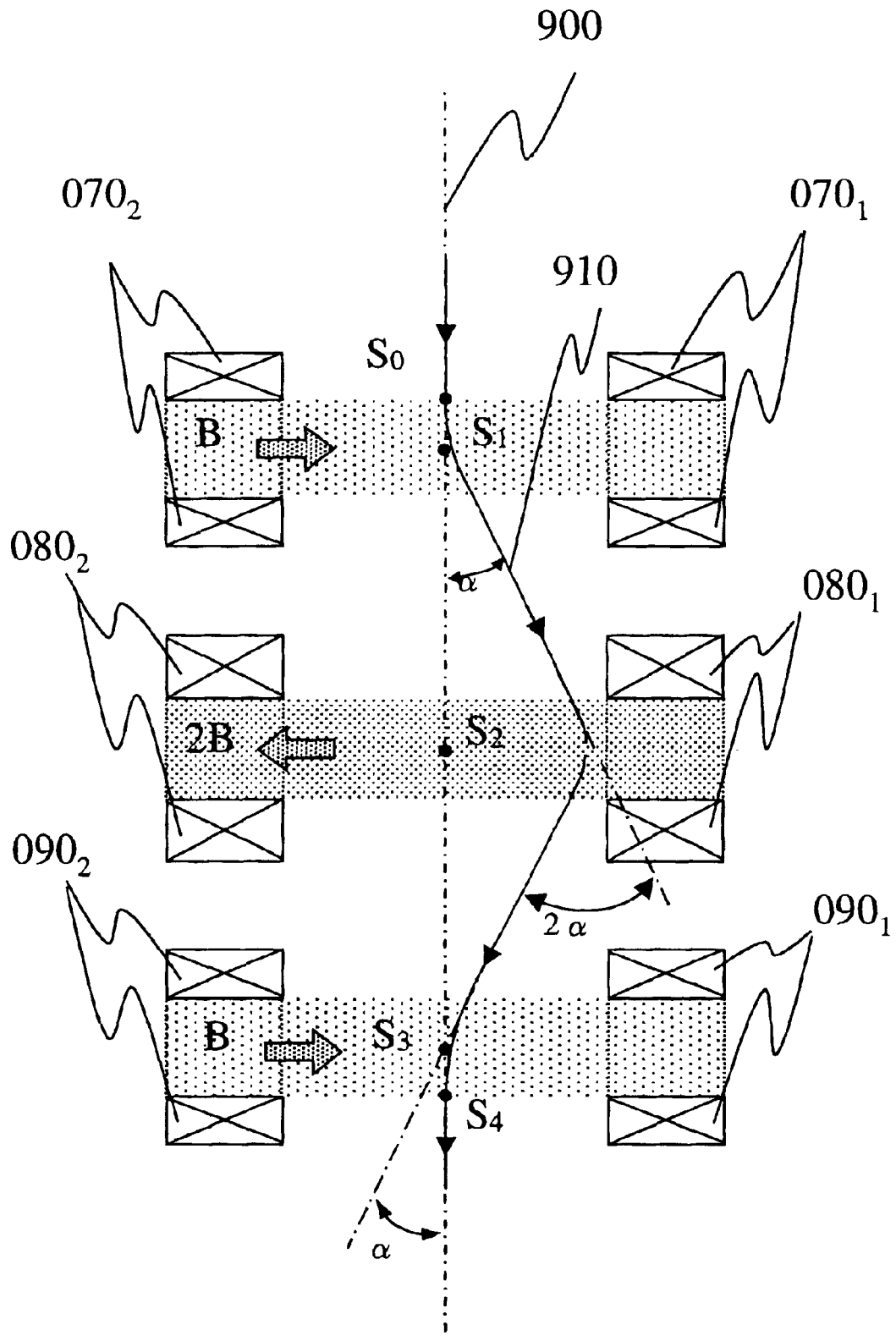
FIG. 1 schematically shows an example in which in a specimen observation system for applying an external magnetic field, general three-step magnetic field application-type beam deflection systems are arranged at an equal interval and symmetrical deflection is made.

It is easily understood that the trajectory 910 of the charged particle beam that passes the point $S_5$ is in parallel with the optical axis as the trajectory 910 of the charged particle beam that passes the point $S_4$ described in relation to FIG. 1 and it is also clear that the position is located on the optical axis. Therefore, the charged particle beam can be radiated always at one point on the optical axis in parallel with the optical axis.

In the meantime, in case the intensity of a magnetic field applied to a specimen is arbitrarily changed, generated deflection quantity varies in front of and at the back of the point $S_5$. Therefore, the magnetic field of the front beam deflector composed of the first beam deflection system and the second beam deflection system is required to be adjusted corresponding to the change so that the charged particle beam is incident on determined one point on the specimen before the intensity of the magnetic field applied to the specimen is changed in parallel with the optical axis, and the magnetic field of the rear beam deflector composed of the third beam deflection system and the fourth beam deflection system is similarly required to be adjusted corresponding to the change so that the charged particle beam outgoing from the specimen is returned onto the optical axis and is incident on an/a imaging/magnifying lens.

That is, in the invention, when a magnetic field applied to a specimen is arbitrarily changed, the respective magnetic fields of the front beam deflector and the rear beam deflector can be univocally made magnitude corresponding to the change. That is, assuming that the intensity of respective magnetic fields of the beam deflection systems is automatically adjusted when an observer adjusts the intensity of a magnetic field of an external magnetic field application system for a specimen according to a condition of observation, a charged particle beam that irradiates the specimen can be incident on the specimen on the optical axis and in parallel with the optical axis without depending upon the intensity of applied magnetic fields.

To apply a magnetic field in all three-dimensional directions to a specimen, external magnetic field application systems of three axes (the x-axis, the y-axis and the z-axis) are prepared for an external magnetic field application system for a specimen and the vector sum of magnetic field intensity generated by each system has only to be a vector sum desired by the observer. When the external magnetic field application systems of three axes are prepared, the magnetic field intensity of the respective beam deflection systems is required to be automatically adjusted corresponding to the variation of the intensity on each axis of a magnetic field applied to the specimen. However, as correspondence to the variation of magnetic field intensity on any axis is enabled, control over deflection on the z-axis by the external magnetic field application system for a specimen will be described below.

Figure 4:
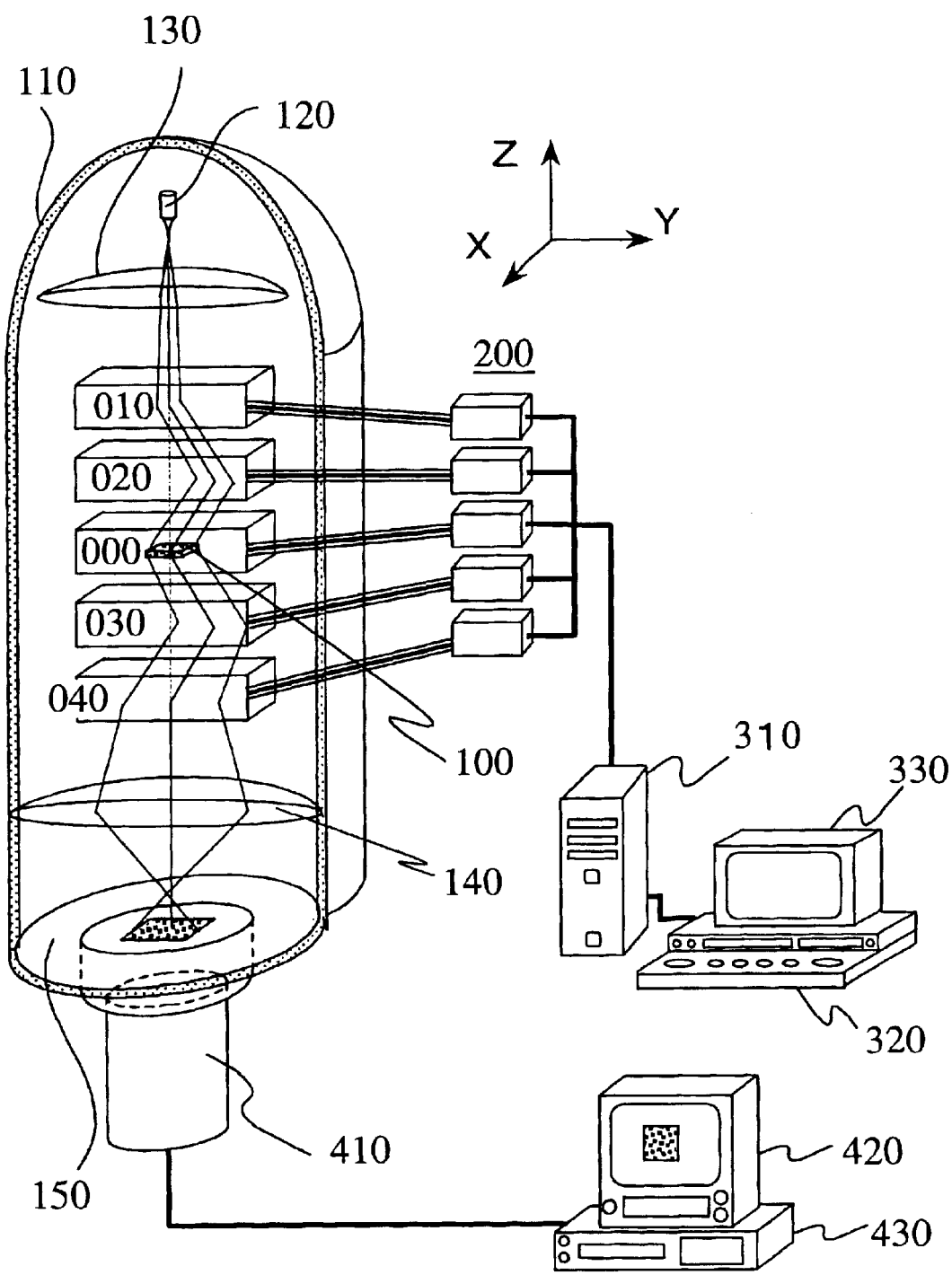
FIG. 4 is a schematic drawing showing the whole configuration of a specimen observation system for applying an external magnetic field in which first to fourth beam deflection systems and an external magnetic field application system for a specimen respectively shown in FIG. 3 are built.

Before the application of a magnetic field in all three-dimensional directions to a specimen is described, the whole configuration of a specimen observation system for applying an external magnetic field in which the first to fourth beam deflection systems described in relation to FIG. 3 and the external magnetic field application system for a specimen are built will be described below. FIG. 4 is a schematic drawing showing the whole configuration. An electron microscope or the similar system related to a charged particle beam is supposed. As shown in FIG. 4, reference numbers 010, 020 are equivalent to the first and second beam deflection systems described in relation to FIG. 3, 000 is equivalent to the external magnetic field application system for a specimen and 030, 040 are equivalent to the third and fourth beam deflection systems. A reference number 100 denotes a specimen and the specimen is arranged in a position (in the external magnetic field application system for a specimen 000) equivalent to at the point $S_5$ shown in FIG. 3. A reference number 120 denotes a source of a charged particle beam. A reference number 130 denotes a condenser optical system and the condenser optical system is formed by an accelerating tube and a condenser lens. A reference number 140 denotes an imaging optical system and the imaging optical system is formed by an imaging lens system such as an objective or a magnifying lens system. A reference number 150 denotes an imaging screen. A reference number 110 denotes a vacuum chamber and in it, the beam deflection systems, the external magnetic field application system for a specimen, the source of a charged particle beam, the lens system and the imaging screen are provided. A reference number 200 denotes an electric power-supply unit for current supplied to coils of the beam deflection systems and the external magnetic field application system for a specimen. In FIG. 4, the reference number 200 is collectively allocated, however, it need scarcely be said that respective coils can be independently controlled. Reference numbers 310, 320 and 330 denote a power supply control computer, a console for a control system and a cathode-ray tube (CRT) for the control system, and they control such as set or vary current supplied to the coils for the beam deflection systems and the external magnetic field application system for a specimen. Reference numbers 410, 420 and 430 denote an image input apparatus (for example, a camera), CRT for image observation and an image recording apparatus (for example, a video tape recorder) and they are provided for monitoring and inputting an image of the specimen acquired on the imaging screen 150.

The coordinate axes of the x-axis, the y-axis and the z-axis are shown in FIG. 4. The x-axis is shown with it directed forward and left on page space, the y-axis is shown with it directed right on the page space and the z-axis is shown with it directed from the downside to the upside on the page space. A positive direction of the z-axis is reverse to a direction in which a charged particle travels. In FIG. 4, the trajectory of a charged particle beam when a magnetic field is applied to a specimen in a direction of the x-axis is drawn, however, in the configuration according to the invention, the displacement from the optical axis of the trajectory of the charged particle beam by the application of the magnetic field to the specimen can be corrected. In the concrete, the charged particle beam is deflected beforehand using the first beam deflection system 010 and the second beam deflection system 020 to negate the amount of deflection by a part in front of the specimen of the magnetic field applied to the specimen so that the trajectory of the charged particle beam on the surface of the specimen is coincident with that before the application of the magnetic field when the magnetic field is applied. Further, the charged particle beam is deflected again using the third beam deflection system 030 and the fourth beam deflection system 040 as described above to negate the amount of deflection by the magnetic field applied to the specimen after the charged particle beam passes the specimen and the trajectory of the charged particle beam is made coincident with the optical axis of the imaging optical system 140. That is, the external magnetic field application system for a specimen 000, the front beam deflector 010 and 020 and the rear beam reflector 030 and 040 are controlled so that the symmetrical trajectory based upon the specimen is drawn at least in the vicinity of the specimen when the charged particle beam passes the specimen.

Figure 5:
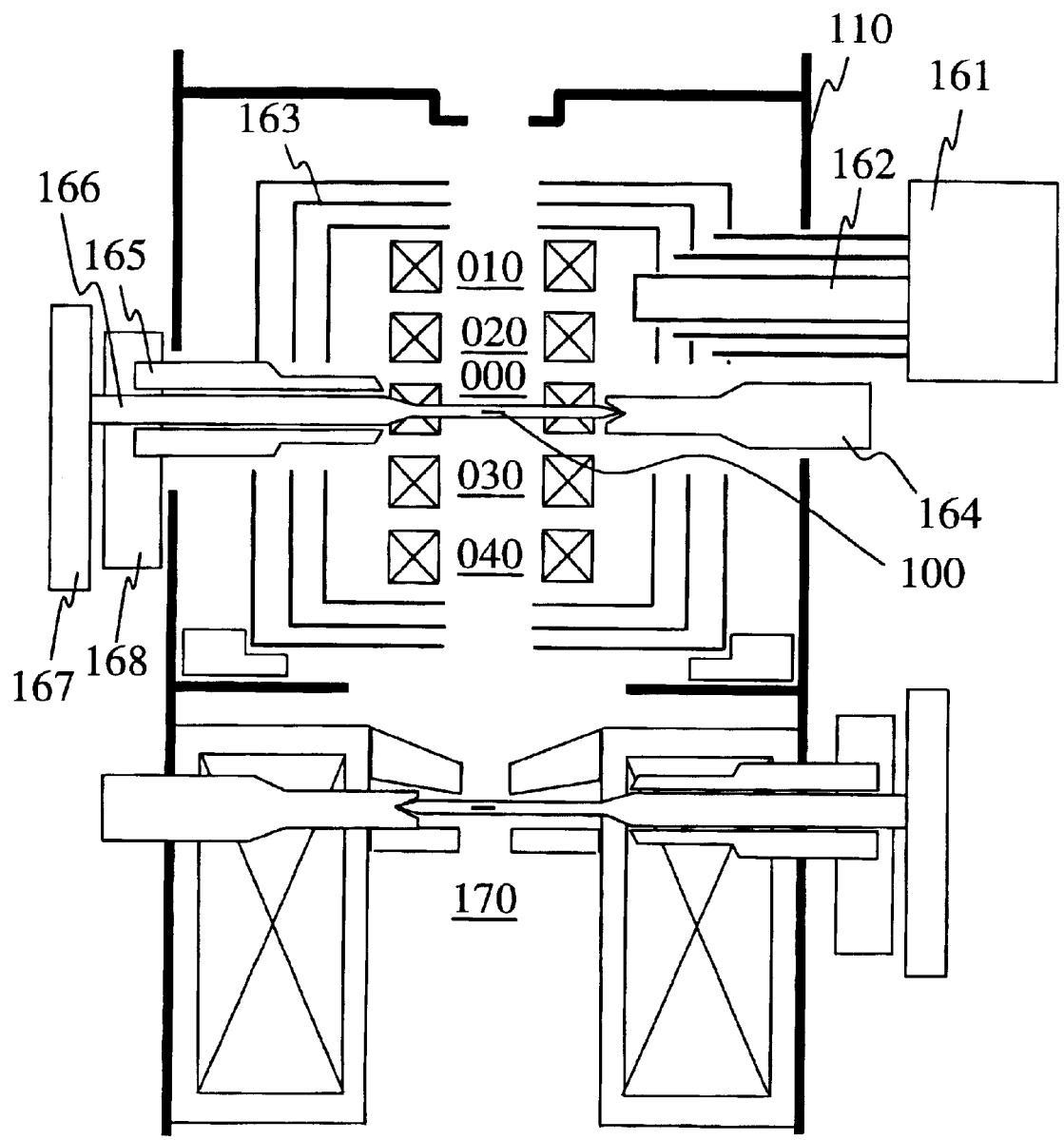
FIG. 5 is a schematic drawing more concretely showing an example in which the first to fourth beam deflection systems and the external magnetic field application system for a specimen are built in the body of an electron microscope.

FIG. 5 is a schematic drawing concretely showing an example in which the first to fourth beam deflection systems and the external magnetic field application system for a specimen are built in the body of an electron microscope. A reference number 110 denotes the external wall of a vacuum chamber. A reference number 170 denotes a normal mechanism for installing and holding a specimen and minutely moving it of a side entry type provided to an objective in a conventional type electron microscope. An example in which first to fourth beam deflection systems 010, 020, 030, 040 and an external magnetic field application system for a specimen 000 are built between the mechanism for installing and holding a specimen and minutely moving it 170 and a condenser optical system 130 is shown. A reference number 161 denotes a cryostat, 162 denotes a heat transfer bar, 163 denotes a radiation shield and the radiation shield is provided to locate the first to fourth beam deflection systems and the external magnetic field application system for a specimen in a cooled atmosphere. Reference numbers 164 and 165 denote a specimen minutely moving unit. A reference number 166 denotes a specimen holder, the specimen holder holds a specimen 100 in the external magnetic field application system for a specimen 000 and holds so that the specimen can be arbitrarily minutely moved in directions of the x-axis and the y-axis by the specimen minutely moving units 164 and 165. A reference number 167 denotes a cooling cryogenic tank and the cooling cryogenic tank cools the specimen 100 via the specimen holder 166. A reference number 168 denotes a specimen spare exhaust mechanism. In this example, the specimen holder 166 of the side entry type is shown, however, a specimen holder of a top entry type can be also installed.

Generally, as the electron microscope includes space between the mechanism for installing and holding a specimen and minutely moving it 170 and the condenser optical system 130, a magnetic field applied state can be observed by the front mechanism for applying an external magnetic field according to the invention and high-resolution observation is enabled by the rear objective as heretofore if a mechanism for applying an external magnetic field according to the invention is installed in this part. One electron microscope can be easily shared by different observation methods. Further, an experiment for simultaneously observing a grid for reference via the rear objective can be also made, observing the magnetic field applied state.

Figure 6:
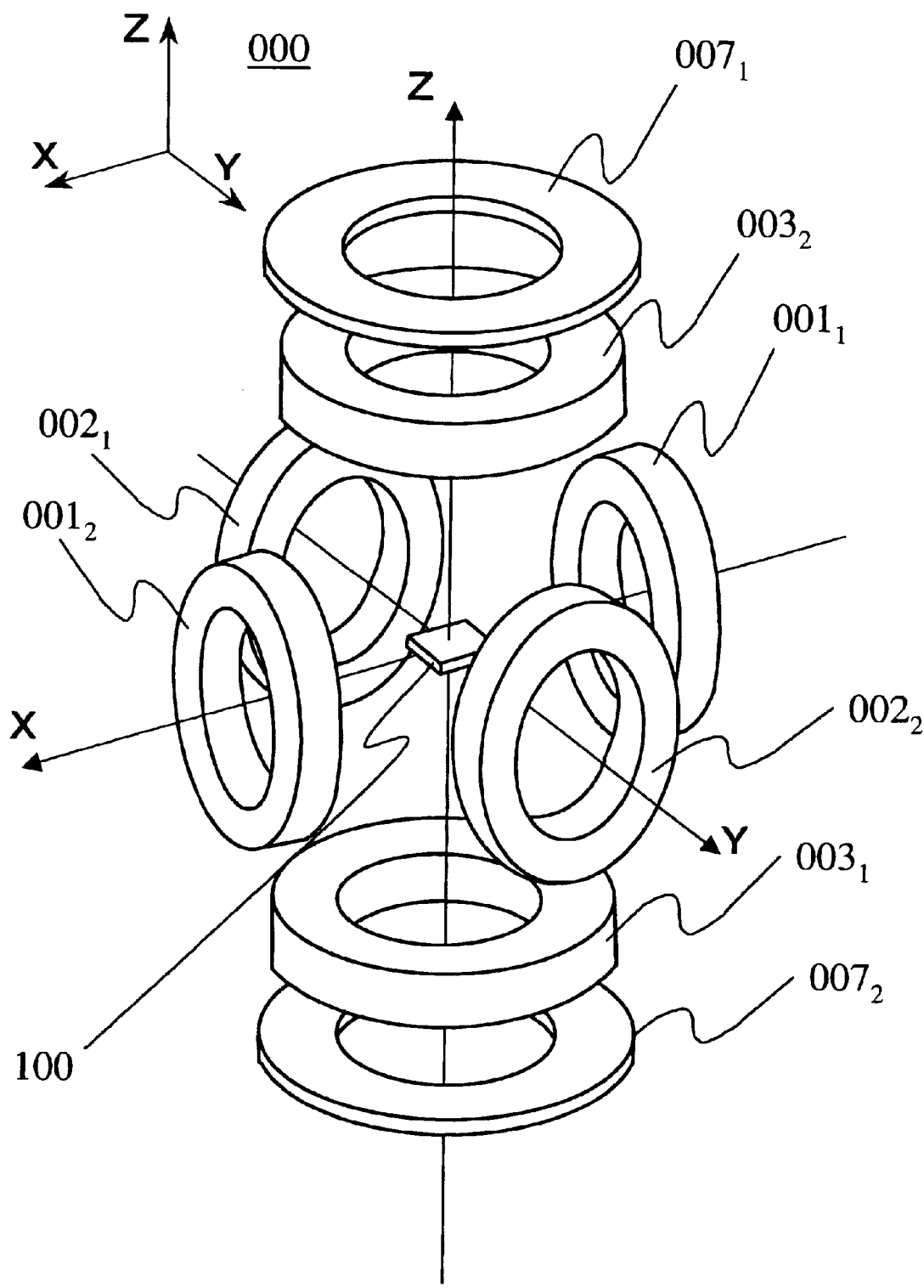
FIG. 6 shows the details of a concrete example in case an external magnetic field application system for a specimen 000 equivalent to an embodiment of the invention is formed by air-core coils.

Next, the application of a magnetic field in all three-dimensional directions to a specimen will be described. FIG. 6 is a detail drawing showing a concrete example in case the external magnetic field application system for a specimen 000 is formed by an air-core coil. Three coil pairs of a pair of x-axis direction magnetic field application coils $001_1$ and $001_2$ for applying a magnetic field in a horizontal direction, a pair of y-axis direction magnetic field application coils $002_1$ and $002_2$ and a pair of z-axis direction magnetic field application coils $003_1$ and $003_2$ for applying a magnetic field in a vertical direction are arranged so that each axis is perpendicular in the center position of each pair. Both coils of each coil pair excite current so that a magnetic field is generated in the same direction. In this case, generally a pair of coils are connected in series so that a magnetic field is generated in the same direction and excitation is made by one power supply. The connection is effective in noise. A reference number 100 denotes a specimen and the specimen is arranged in the center position of each coil pair. The vector sum of magnetic fields applied in the directions of the x-axis, the y-axis and the z-axis by respective magnetic field application coil pairs is equivalent to the intensity and the bearing of the magnetic fields applied to the specimen. This is based upon a principle that in space, magnetic fields are physical quantity which can be coupled in linearity and hereby, the application of magnetic fields in all three-dimensional directions is enabled. Reference numbers $007_1$ and $007_2$ denote a magnetic shield and the magnetic shields are arranged over and under the z-axis direction magnetic field application coils $003_1$ and $003_2$. In the case of the air-core coil, as magnetic fields are distributed in a relatively large range, the external magnetic field application system for a specimen 000 may have an effect upon magnetic fields generated by upper and lower beam deflection systems and therefore, a magnetic shield made of magnetic material is arranged between a second beam deflection system and the external magnetic field application system for a specimen 000 and between the external magnetic field application system for a specimen and a third beam deflection system. In FIG. 3, only the x-axis direction magnetic field application coils $001_1$ and $001_2$ are shown as the external magnetic field application system for a specimen 000. This reason is that in relation to FIG. 3, only displacement by deflection between the optical axis 900 and the trajectory 910 of the charged particle beam is described.

The reason why the coil pairs are used for the external magnetic field application system for a specimen 000 is that the trajectory space (the path) of a charged particle beam is secured in a magnetic field region and as a uniform applied magnetic field as possible is made. Hysteresis for the quantity of current supplied to the coil is avoided by using the air-core coil and magnetic fields can be precisely controlled from a strong magnetic field to a weak magnetic field in the intensity and the bearing.

Figure 7:
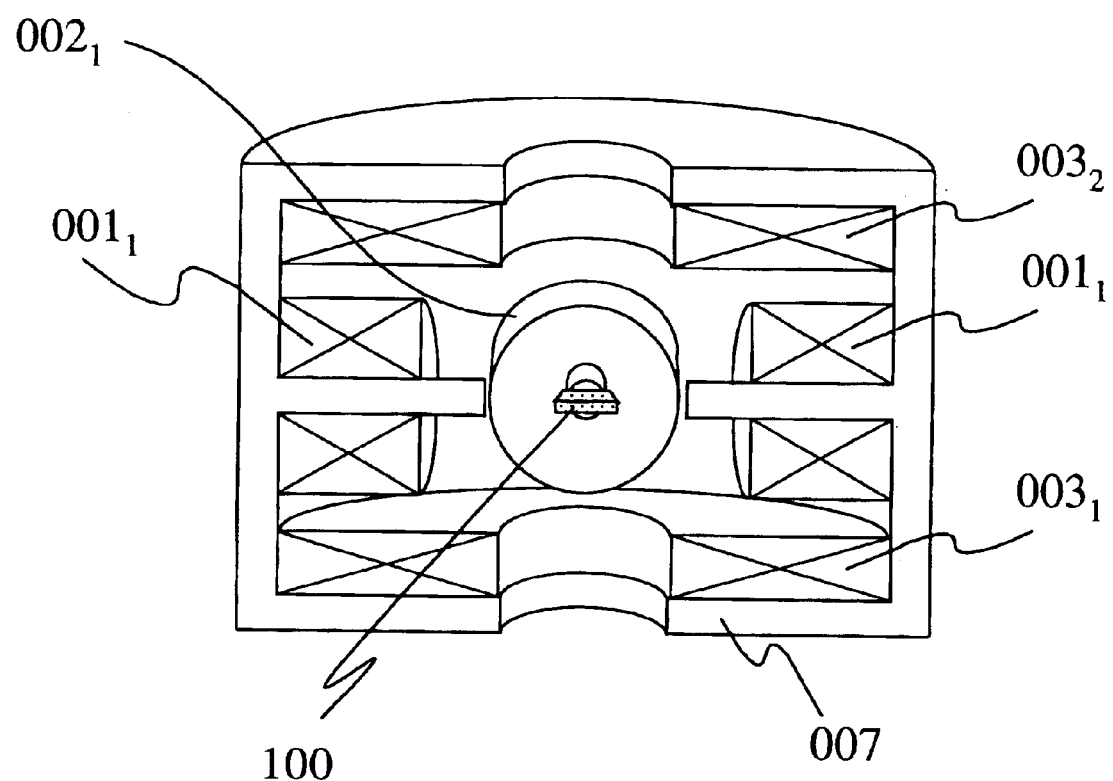
FIG. 7 shows the details of a concrete example in case the external magnetic field application system for a specimen 000 equivalent to the embodiment of the invention is composed of coil pairs using magnetic material such as iron for a core.

In case hysteresis for excited current does not matter in a magnetic field applied to the specimen and a strong magnetic field is required to be applied in as small space as possible, the external magnetic field application system for a specimen 000 can be formed by a coil pair the core of each coil of which is made of magnetic material such as iron. FIG. 7 is a schematic sectional view showing one example viewed slightly from the upside. A magnetic core made of the same material as the magnetic shield 007 made of magnetic material such as permalloy and formed not only over and under a pair of x-axis direction magnetic field application coils $001_1$ and $001_2$ and a pair of y-axis direction magnetic field application coils $002_1$ and $002_2$ but around the pairs is provided (in FIG. 7, the coil $002_2$ is not shown). As a pair of z-axis direction magnetic field application coils $003_1$ and $003_2$ for applying a magnetic field in a vertical direction require the path of a charged particle beam, the pair remains an air coil. In this example, as the coils for applying a magnetic field in a horizontal direction are not an air core coil, a specimen 100 cannot be arranged in the center position of each magnetic field as shown in FIG. 6 using a specimen holder of a side entry type. In this case, the specimen is inserted between the coils for applying the magnetic field in the horizontal direction, that is, along an axis having an angle of 45 with the x-axis and the y-axis. Or a specimen holder of a top entry type may be also used.

Figure 2:
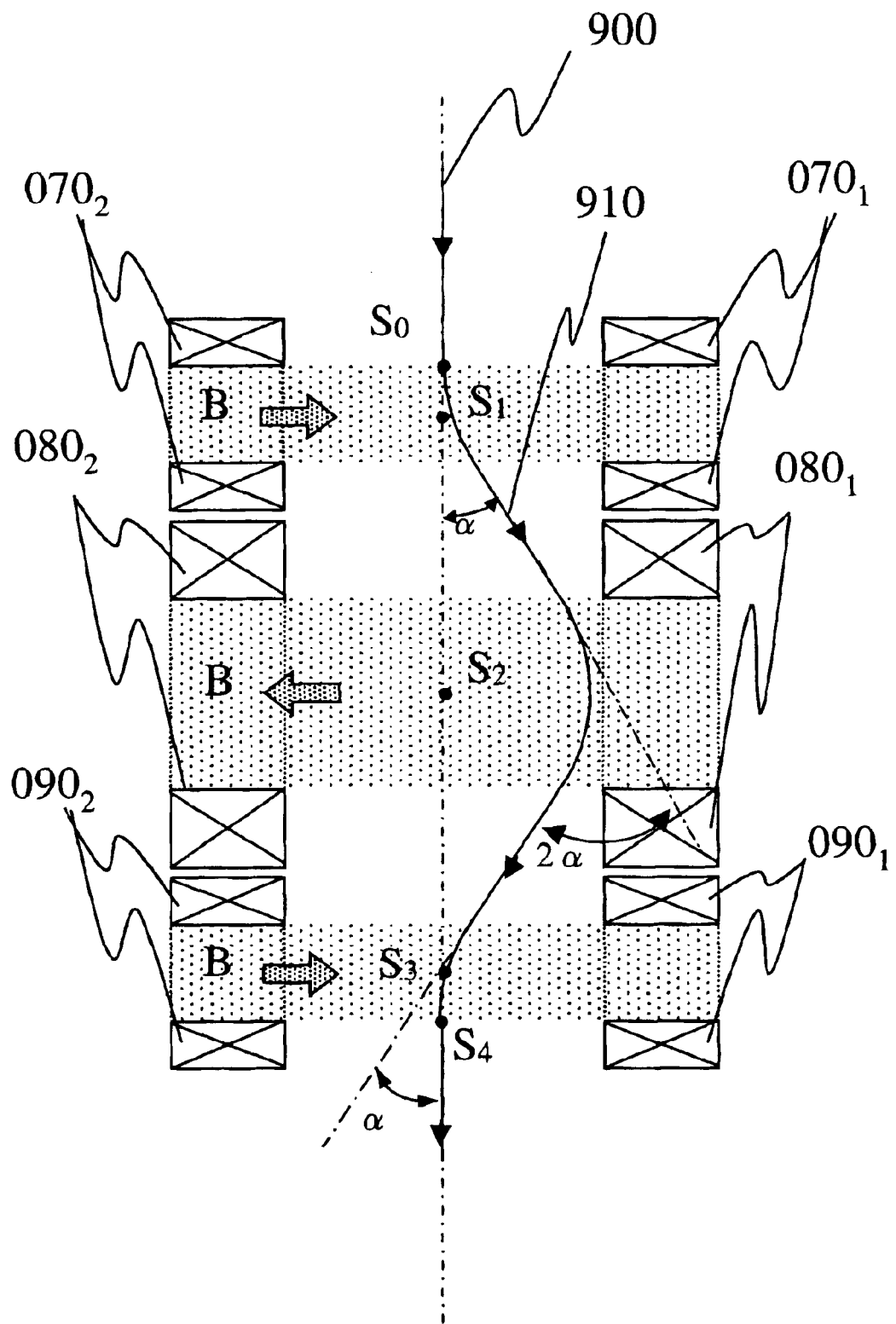
FIG. 2 shows another example of the conventional type three-step magnetic field application-type beam deflector.
Figure 8:
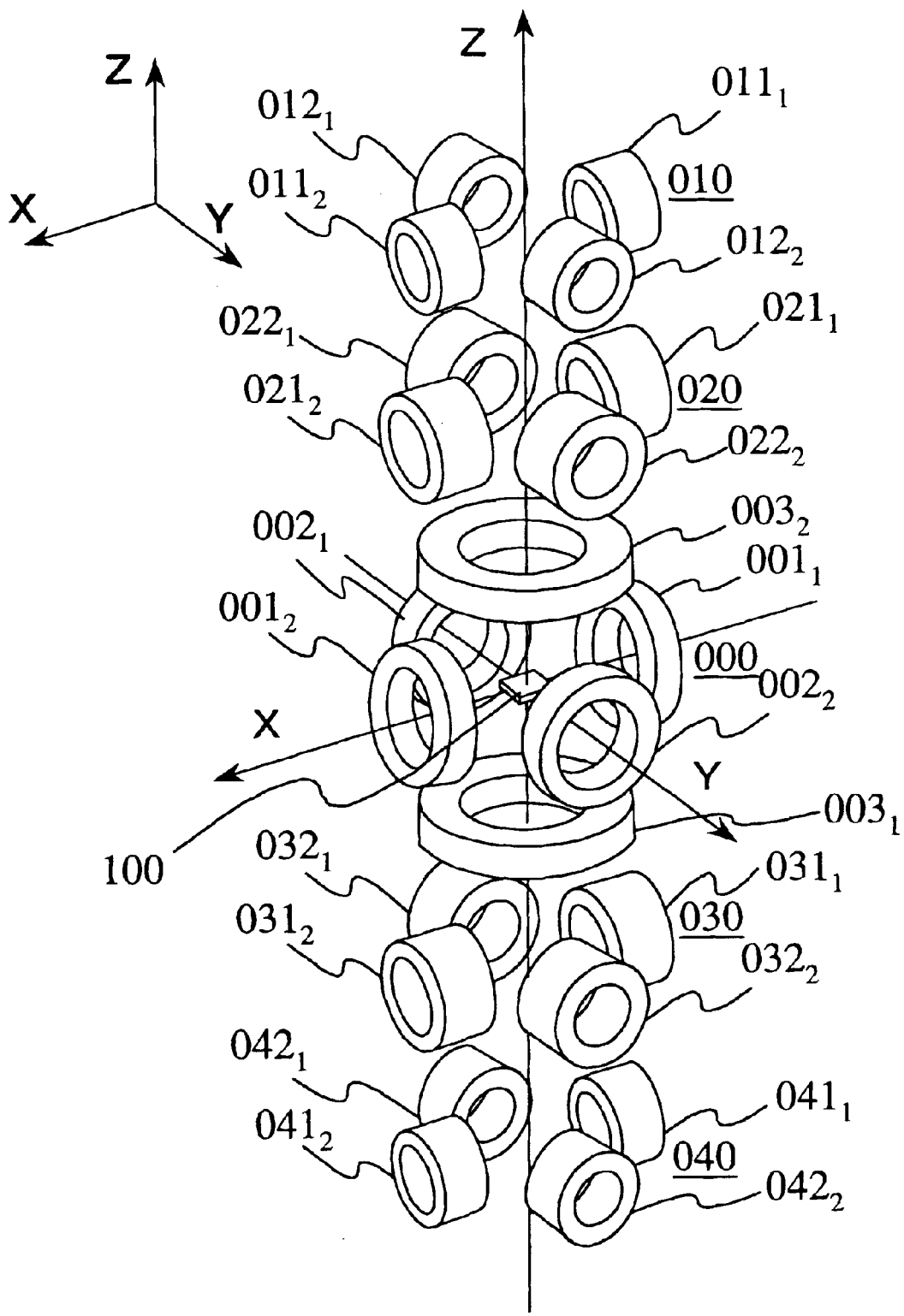
FIG. 8 is a schematic drawing showing the details of a concrete example when the first to fourth beam deflection systems and the external magnetic field application system of the specimen observation system for applying an external magnetic field are all composed of air-core coils.

FIG. 8 is a schematic drawing showing the details of a concrete example of the specimen observation system for applying an external magnetic field according to the invention when the external magnetic field application system for a specimen described in relation to FIG. 6 that can apply magnetic fields in all three-dimensional directions to the specimen and first to fourth beam deflection systems all have an air core. As known referring to FIGS. 3 and 6, in FIG. 8, each of a first beam deflection system 010 to a fourth beam deflection system 040 is provided with a pair of coils the axis of which is directed in a direction of the x-axis and a pair of coils the axis of which is directed in a direction of the y-axis. In an external magnetic field application system for a specimen 000, a magnetic shield 007 is not shown, however, the magnetic shield has the same configuration as that in FIG. 6. FIGS. 8 and 3 correspond in a function of the coils, however, the coils are different in size. As shown in FIG. 8, coils having a larger diameter than that of coils in the first and fourth beam deflection systems for the second beam deflection system and the third beam deflection system, and a state that each magnetic field region produced by the second beam deflection system and the third beam deflection system is larger than each magnetic field region produced by the first and fourth beam deflection systems as shown in FIG. 2 is schematically represented. In the meantime, the size of the external magnetic field application system is represented further largely because the specimen 100 is visibly largely shown. In the size shown in FIG. 8, there is essentially no technical meaning.

Reference numbers $011_1$ and $011_2$ denote a pair of coils for applying a magnetic field in a direction of the x-axis of the first beam deflection system 010, and $012_1$ and $012_2$ denote a pair of coils for applying a magnetic field in a direction of the y-axis of the first beam deflection system 010. Reference numbers $021_1$ and $021_2$ denote a pair of coils for applying a magnetic field in the direction of the x-axis of the second beam deflection system 020, and $022_1$ and $022_2$ denote a pair of coils for applying a magnetic field in the direction of the y-axis of the second beam deflection system 020. Reference numbers $031_1$ and $031_2$ denote a pair of coils for applying a magnetic field in the direction of the x-axis of the third beam deflection system 030, and $032_1$ and $032_2$ denote a pair of coils for applying a magnetic field in the direction of the y-axis of the third beam deflection system 030. Reference numbers $041_1$ and $041_2$ denote a pair of coils for applying a magnetic field in the direction of the x-axis of the fourth beam deflection system 040, and $042_1$ and $042_2$ denote a pair of coils for applying a magnetic field in the direction of the y-axis of the fourth beam deflection system 040.

Both coils of each coil pair are connected in series so that a magnetic field is generated coaxially and in the same direction and excitation is made by one power supply. In FIG. 3, the control of the deflection of the charged particle beam is described only in relation to the x-axis, however, in the configuration shown in FIG. 8, the vector sum of magnetic fields applied in the directions of the x-axis and the y-axis of each beam deflection system determines the intensity and the bearing of deflection in each beam deflection system. The radiation on the specimen of a charged particle beam coincident with the optical axis and radiation coincident with the optical axis of an imaging optical system in the rear of the system according to the invention are compatible as described above by controlling an excited state in the direction of the x-axis and in the direction of the y-axis of each of first to fourth beam deflection systems corresponding to the intensity and the bearing of a magnetic field applied to the specimen by the external magnetic field application system for a specimen 000.

The deflection angle required in each beam deflection system of a charged particle beam depends upon the intensity of a generated magnetic field, the width of a magnetic field region, distance between the first beam deflection system and the second beam deflection system, distance between the second beam deflection system and the external magnetic field application system for a specimen, distance between the external magnetic field application system for a specimen and the third beam deflection system and distance between the third beam deflection system and the fourth beam deflection system and various variations are conceivable.

Assuming that the first to fourth beam deflection systems and the external magnetic field application system for a specimen respectively adopted in the invention are formed by an air-core coil, magnetic field intensity and others will be described in mathematical expressions below. For these external magnetic field application systems, a beam deflection system composed of a pair of two air-core coils having the same axis is supposed. As magnetic field intensity H axially generated on the axis of the coils and at the middle point of the coil pair can be added in linearity if the center distance of two coils is M, it is acquired in Mathematical expression 1.

(Mathematical expression 1)

$$H(M) = \frac{NI}{2L(a_2-a_1)} \times \left\{ \begin{array}{l} (M+L)\ln\frac{2a_2+\sqrt{4a_2^2+(M+L)^2}}{2a_1+\sqrt{4a_1^2+(M+L)^2}} - \\ (M-L)\ln\frac{2a_2+\sqrt{4a_2^2+(M-L)^2}}{2a_1+\sqrt{4a_1^2+(M-L)^2}} \end{array} \right\} = KI$$

In the above expression, N denotes the number of turns of the coil, $a_1$ and $a_2$ denote the inside radius and the outside inside radius of the coil, L denotes the length of the coil and I denotes current for exciting the coil pair. When a constant related to the coils is expressed by K in total, a generated magnetic field is proportional to the quantity of current I for exciting the coil pair and is expressed as H=KI.

When a constant determined by the quantity of current (Ix, Iy, Iz) to each coil pair for applying an external magnetic field in the directions of the x-axis, the y-axis and the z-axis, the number of turns of each coil (Nx, Ny, Nz), the inside radius of each coil ($a_1x$, $a_1y$, $a_1z$), the outside radius of each coil ($a_2x$, $a_2y$, $a_2z$), the length of each coil (Lx, Ly, Lz) and the center distance of each coil pair (Mx, My, Mz) is (Kx, Ky, Kz), relation between current and a generated magnetic field is expressed in Mathematical expression $$\left. \begin{array}{l} Bx = \mu_0 \times Kx \times Ix \\ By = \mu_0 \times Ky \times Iy \\ Bz = \mu_0 \times Kz \times Iz \end{array} \right\} \quad \text{(Mathematical expression 2)}$$

However, in the above expression, the relation is expressed by magnetic flux density B. "$\mu_0$" denotes permeability in a vacuum and its value is $4\pi \times 10^{-7}$.

Figure 9:
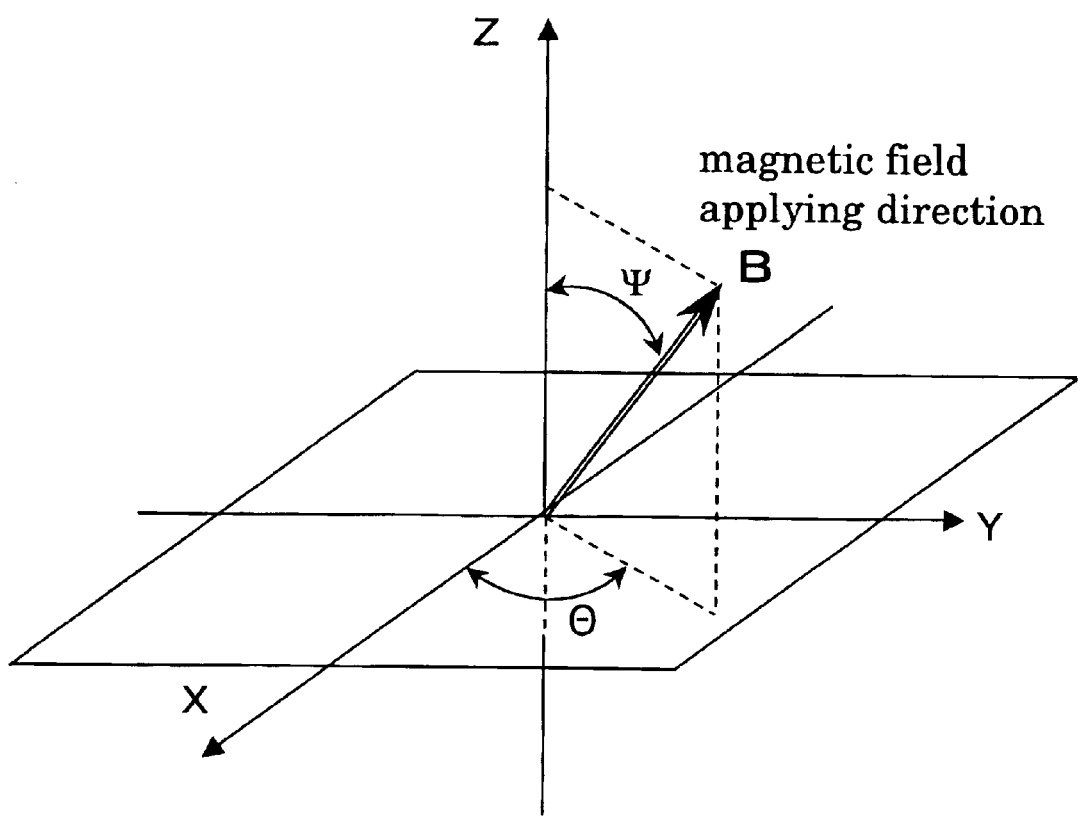
FIG. 9 shows a space coordinate system for explaining the outline of a method of adjusting the optical axis of an electron beam in case the invention is applied to an electron microscope.

To clarify the bearing of an applied magnetic field, display in a spherical coordinate system (B, θ, Ψ) shown in FIG. 9 is convenient. When Mathematical expression 2 is rewritten based upon the spherical coordinate system (B, θ, Ψ), Mathematical expression 3 is acquired.

$$\left. \begin{array}{l} B = \mu_0 \sqrt{(Kx \cdot Ix)^2 + (Ky \cdot Iy)^2 + (Kz \cdot Iz)^2} \\ \theta = \mathrm{Tan}^{-1}\left(\frac{Ky \cdot Iy}{Kx \cdot Ix}\right) \\ \Psi = \mathrm{Tan}^{-1}\left(\frac{\sqrt{(Kx \cdot Ix)^2 + (Ky \cdot Iy)^2}}{Kz \cdot Iz}\right) \end{array} \right\} \quad \text{(Mathematical expression 3)}$$

In the above expression, B denotes the magnitude of magnetic flux density applied to a specimen, θ denotes an angle of rotation (counterclockwise: positive) in XY-plane from the x-axis which is a horizontal direction and Ψ denotes an angle between the z-axis and a magnetic flux vector. It need scarcely be said that each value acquired in Mathematical expression 3 is converted to the magnitude of current and is supplied to the coil and it is expressed in Mathematical expression 4.

$$\left. \begin{array}{l} Ix = \frac{1}{\mu_0 Kx} B\cos\theta\sin\Psi \\ Iy = \frac{1}{\mu_0 Ky} B\sin\theta\cos\Psi \\ Iz = \frac{1}{\mu_0 Kz} B\cos\Psi \end{array} \right\} \quad \text{(Mathematical expression 4)}$$

Next, the motion of a charged particle in a magnetic field will be described. When the rectangular coordinate system is used again, an equation of motion of a charged particle in a magnetic field is expressed in Mathematical expression 5.

$$m\vec{r} = q\vec{v} \times \vec{B} \quad \text{(Mathematical expression 5)}$$

In the above expression, m denotes the mass of the particle, q denotes charge, v denotes velocity and B denotes magnetic flux density. Assuming that deflection is small to simplify and if $v=v_z$, $v_z$ dt=dz, if a magnetic field is applied in the direction of the x-axis, the direction of deflection is the x-axis and Mathematical expression 6 is acquired.

$$m\dot{y} = q\int v_z Bx dt \brace = q\int Bx dz \text{ (Mathematical expression 6)}$$

Hereby, a deflection angle α is acquired in Mathematical expression 7 and the quantity of deflection y is acquired in Mathematical expression 8.

$$\alpha = \frac{v_y}{v_z} \atop = \frac{\dot{y}}{\dot{z}} \atop = \frac{q}{mv}\int Bx dz \text{ (Mathematical expression 7)}$$

$$y = \frac{q}{m}\int\int Bx dz dt \atop = \frac{q}{mv}\int\int Bx d^2 z \atop = \int \alpha dz \text{ (Mathematical expression 8)}$$

That is, the deflection angle is proportional to the integral of a direction in which a corpuscular beam travels in the magnetic field and the quantity of deflection is proportion to the integral of a direction in which the deflection angle travels.

To relate the quantity of deflection by each beam deflection system to the intensity of a magnetic field applied to a specimen or to the variation of the bearing, the efficiency of deflection by each beam deflection system for a charged particle beam is measured beforehand using the relation and is described as a function of a magnetic field applied to the specimen. Control is executed by the computer 310 so that deflection is made corresponding to a magnetic field applied to the specimen based upon the predetermined function. The displacement by rotation by a component of an applied magnetic field parallel to the optical axis of a charged particle beam optical system with the optical axis of a charged particle beam in the center of the trajectory will be described later, however, the displacement can be similarly corrected by also measuring the displacement beforehand and relating it to the predetermined function.

In FIG. 3, for the convenience sake of construction, it is supposed that each range of the magnetic field regions by the second and third beam deflection systems is the same as that by the first and fourth beam deflection systems and the predetermined deflection angle −2α is acquired by doubling applied magnetic field intensity. As described above, a range of a magnetic field region, magnetic field intensity and distance between magnetic field regions are factors that determine the configuration of beam deflection systems. For example, for a magnetic field at the point $S_5$ shown in FIG. 3 at which the specimen is located, the maximum magnetic field intensity which can be applied to the specimen is increased to double, compared with a magnetic field at the points $S_1$ and $S_2$ shown in FIGS. 1 and 2 at which the specimen is located.

The above description is based upon an ideal situation and realistically, CFA does not hold true. That is, in Mathematical expressions 6 to 8, Bx is also required to be described in functions of X, Y, Z. Therefore, the real trajectory of a charged particle beam is displaced by only the control described above. Then, to make a charged particle beam more precisely pass one determined point on a specimen in parallel with the optical axis, a sub-second beam deflection system can be arranged at the back of the second beam deflection system (in front of an external magnetic field application system for a specimen and a sub-third beam deflection system can be arranged in front of the third beam deflection system (at the back of the external magnetic field application system). The sub beam deflection systems can be also controlled based upon the predetermined function as other beam deflection systems and the external magnetic field application system. Further, the generation of a deflection component which cannot be described in a function by a specimen itself for a charged particle beam and the fluctuation of deflection effect for a charged particle beam in the whole system can be easily corrected by manually adjusting the magnetic field intensity of the sub beam deflection systems.

Referring to FIG. 3, the principle of the deflection by the transverse magnetic field of the charged particle beam in a direction apart from the optical axis and the correction of it are described, however, as described in relation to FIG. 6, in the invention, the external magnetic field application system for a specimen can freely vary a magnetic field applied to a specimen in the three-dimensional directions. When a charged particle beam is incident on the external magnetic field application system in case the external magnetic field application system applies a longitudinal magnetic field, a circular trajectory is drawn with the optical axis in the center in the magnetic field. The same problem also occurs when the charged particle beam passes the specimen and is out-going from the external magnetic field application system. Therefore, the correction for the circular trajectory with the optical axis in the center of the charged particle beam is required to be also included in the control over the deflection of the charged particle beam by the front beam deflector and the rear beam deflector. This will be described below, however, it will be first described that the deflection described in relation to FIG. 3 of the charged particle beam actually draws a circular trajectory by the deflection by the transverse magnetic field of the charged particle beam.

Figure 10:
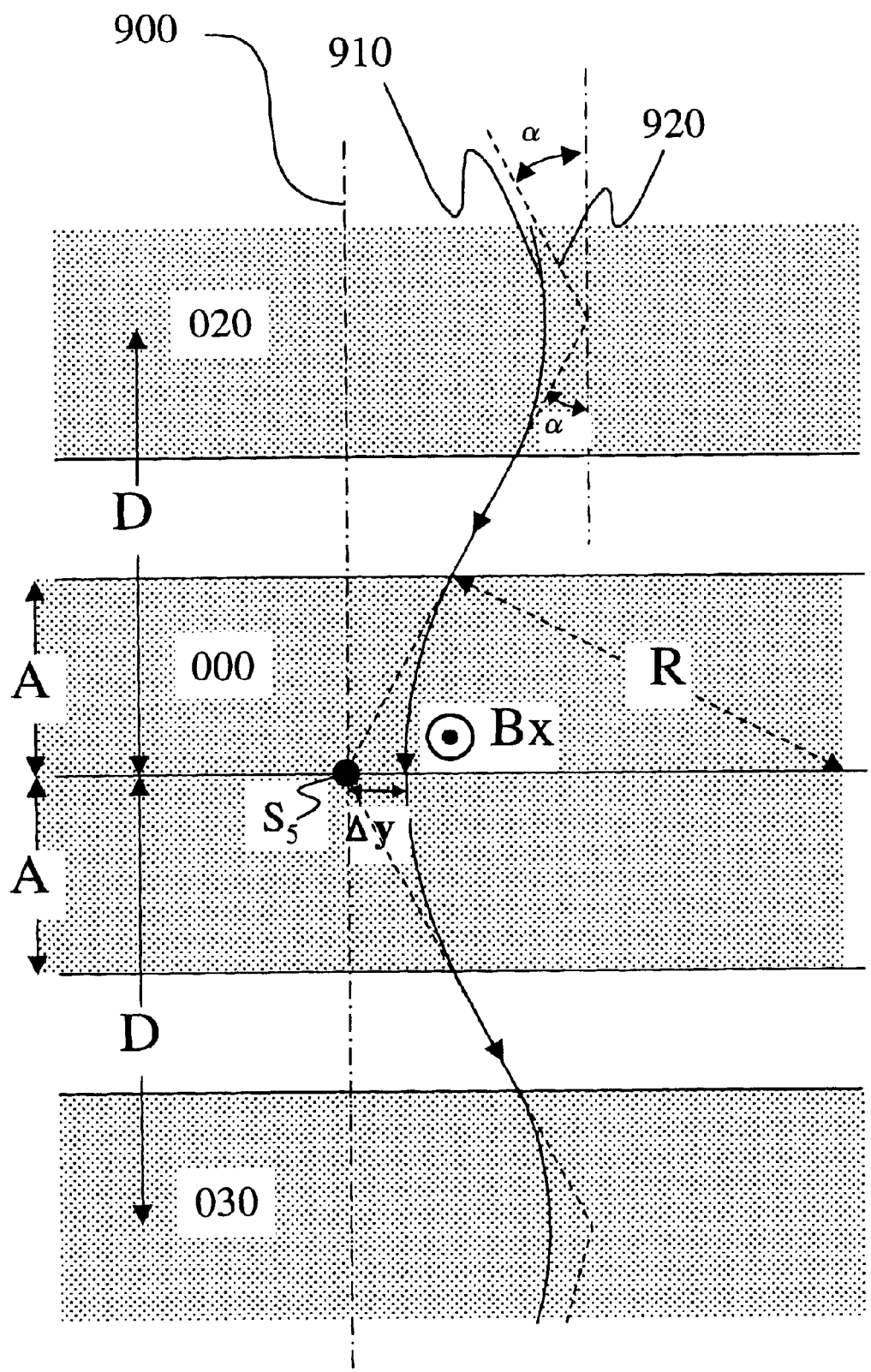
FIG. 10 is an explanatory drawing for explaining the displacement caused because a charged particle beam draws a circular trajectory from the optical axis of the charged particle beam.

FIG. 10 is an explanatory drawing for explaining the displacement from the optical axis of a charged particle beam caused by the fact that the charged particle beam actually draws the circular trajectory by the deflection by a transverse magnetic field. Magnetic fields produced by a second beam deflection system 020, an external magnetic field application system for a specimen 000 and a third beam deflection system 030 and the trajectory of the charged particle beam deflected by them are drawn. For the convenience sake of construction, it is supposed that the magnetic fields are applied only in a direction of the x-axis (in a direction perpendicular to page space) and the charged particle beam is deflected (on the page space) in a direction of the y-axis. A magnetic field region is dotted using CFA described above. When the trajectory of the charged particle beam 910 is geometrically drawn by a straight line, it is coincident with the optical axis 900 at a point $S_5$ where the specimen is located as approximately shown by a dotted line 920. However, as the charged particle beam 910 realistically draws a circular trajectory as shown by a full line, it can be made to pass the point $S_5$ in parallel with the optical axis 900 by the deflection and the deflection angle for returning described in relation to FIG. 3, however, a position which it passes is displaced by Δy from the optical axis in the direction of the y-axis.

The quantity of the displacement can be analytically acquired in case CFA holds true. As shown in FIG. 10, if a transverse magnetic field applied to the specimen is Bx, the radius of the trajectory of the rotation of the charged particle beam is R and the length along the optical axis of a magnetic field applied by the external magnetic field application system 000 is 2A, the inclination α of the charged particle beam is acquired in Mathematical expression 9.

$$\alpha \approx \sin\alpha = \frac{A}{R} \qquad \text{(Mathematical expression 9)}$$

In the meantime, when the center of the rotation of the circular trajectory is located on the y-axis, the position is acquired by calculating y=R/cos α. Therefore, the quantity Δy of the displacement from the optical axis of the trajectory of the charged particle beam is acquired in Mathematical expression 10.

$$\begin{aligned}\Delta y &= R\left(\frac{1}{\cos\alpha} - 1\right) \\ &\approx \frac{R\alpha^2}{2} \\ &= \frac{A}{2}\cdot\alpha \\ &= \frac{1}{B\times R}\cdot\frac{B\times A^2}{2}\end{aligned} \qquad \text{(Mathematical expression 10)}$$

In the above expression, B·R is a constant determined only by the mass m and the velocity v of a charged particle and charge q without depending upon the intensity of a magnetic field and is acquired by calculating [B×R]=mv/q as the product of magnetic flux density B and the radius R of the trajectory of rotation.

For the magnitude of the displacement, a case of an electron beam the accelerating voltage of which is 1 MV will be discussed below. $[B\times R]_{1MV}=4.73\times 10^{-3}$ (Wb/m) and if Bx=0.02 (Wb/m²) (=20 mT) and 2A=40×10⁻³ (m) are used for an appropriate value of the external magnetic field application system for a specimen, the quantity Δy of the displacement from the optical axis of the electron beam is Δy=0.2 (mm). This quantity is a large amount which cannot be ignored for observing or processing a minute thing. That is, any correction of the displacement is essential.

To correct displacement by the circular trajectory of a point at which the electron beam passes the specimen, the center of rotation of the circular trajectory is required to be displaced by Δy in a reverse direction (in a negative direction on the y-axis in FIG. 10). Distance Δz in the direction of the z-axis by which the electron beam travels while a charged particle beam incident at an angle α with the optical axis travels by Δy on the y-axis is acquired in Mathematical expression 11 based upon Mathematical expression 10.

$$\begin{aligned}\Delta z &= \frac{\Delta y}{\tan\alpha} \\ &= \frac{1}{\alpha}\cdot\frac{R\alpha^2}{2} \\ &= \frac{A}{2}\end{aligned} \qquad \text{(Mathematical expression 11)}$$

The distance does not depend upon the angle of incidence of the particle beam. That is, it means that if a charged particle beam is incident not at an origin (Z=0) on the optical axis on but in front by z=A/2, the charged particle beam always returns on the optical axis 900 at the point $S_5$ where the specimen is located. In other words, the center of locking of the charged particle beam has only to be z=A/2. To realize this, there are the following two methods.

1. Distance between the second beam deflection system and the external magnetic field application system is made longer than distance between the first beam deflection system and the second beam deflection system by A/2.
2. When a magnetic field is applied to the same specimen, the front beam deflector is adjusted so that the angle of incidence of the particle beam is 2Dα/(2D−A).

In this case, D denotes distance between the center position of the second beam deflection system 020 and the center position of the external magnetic field application system 000 and distance between the center position of the external magnetic field application system 000 and the center position of the third beam deflection system 030.

The second method means that the charged particle beam is deflected again larger by the second beam deflection system 020 or that the charged particle beam is deflected small by the first beam deflection system, and a method of controlling the first to fourth beam deflection systems individually or a method of equalizing intensity for exciting each beam deflection system and separately controlling by the sub beam deflection systems is effective.

In the configuration according to the invention, a magnetic field is applied to a specimen in an arbitrary direction. The sub beam deflection systems more effectively function when a magnetic field (a longitudinal magnetic field) in the direction of the z-axis is applied to the specimen. The displacement from the optical axis by rotation of the trajectory of a charged particle beam in case a longitudinal magnetic field is applied to a specimen will be described below.

Figure 11:
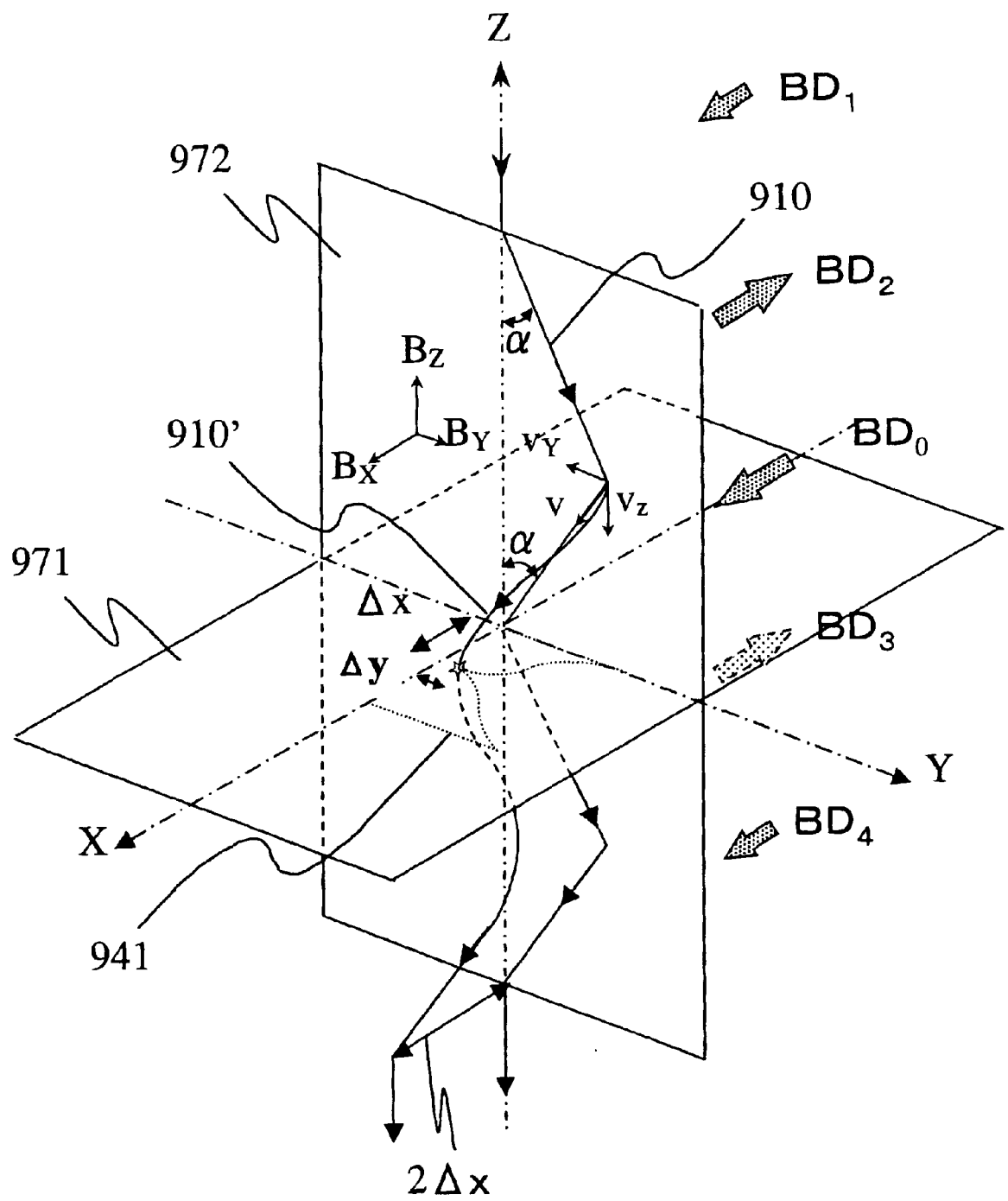
FIG. 11 is an explanatory drawing for schematically explaining the trajectory of a charged particle beam in case both a longitudinal magnetic field and a transverse magnetic beam are applied to a specimen.

FIG. 11 is a schematic explanatory drawing for explaining the trajectory of the charged particle beam in case the longitudinal magnetic field is applied to the specimen and for convenience sake of construction, only a range of the first beam deflection system 010 to the upside of the fourth beam deflection system 040 is shown. Arrows to which reference numbers $BD_1$ to $BD_4$ are allocated denote the directions of magnetic fields by the respective beam deflection systems. A reference number $BD_0$ denotes a transverse magnetic field by the external magnetic field application system for a specimen 000. These correspond to those in FIG. 3. To clarify the trajectory of a charged particle beam, an XY-plane 971 and a YZ-plane 972 are drawn. However, a coil and a specimen are omitted for simplification. A reference number 910 denotes the trajectory of the charged particle beam without a longitudinal magnetic field in case a circular trajectory is not considered as described in relation to FIG. 10 and the trajectory corresponds to the reference number 920 shown by a broken line in FIG. 10. A reference number 910' denotes the trajectory of the charged particle beam in case a circular trajectory by Lorentz force caused when the trajectory 910 of the charged particle beam travels in a magnetic field in which a longitudinal magnetic field exists, being deflected again between the second beam deflection system 020 and the third beam deflection system 030 is considered. That is, in the external magnetic field application system 000, as magnetic fields in both directions of the x-axis and the z-axis are applied to the specimen and the charged particle beam travels on a circular trajectory based upon rotation having the directions of the magnetic fields as axes, the trajectory after the charged particle beam is deflected again by the second beam deflection system 020 is shown in consideration of the effect. A reference number 941 denotes the projection of the trajectory 910' of the charged particle beam to the XY-plane 971 (however, only between the first beam deflection system and the fourth beam deflection system). As shown in the projection, before the charged particle beam is deflected again by the second beam deflection system 020, it travels on the y-axis and after the charged particle beam is deflected again by the second beam deflection system 020, 910' passes the specimen in a position (a position off by Δx, Δy from the optical axis 900) shown by an asterisk on the XY-plane 971 by the effect of the longitudinal magnetic field and the circular trajectory. Afterward, before the charged particle beam is deflected again by the third beam deflection system 030, it similarly travels on a curved trajectory by the effect of the circular trajectory by the longitudinal magnetic field and afterward, after the charged particle beam is deflected again by the third beam deflection system 030, it returns to the x-axis (a position off by 2Δx from the optical axis 900) in parallel with the y-axis. As described above, as for the motion of the charged particle beam by a component in a horizontal direction of a magnetic field, the trajectory of the charged particle beam is matched with the optical axis 900 using the front beam deflector including the first beam deflection system 010 and the second beam deflection system 020 and the rear beam deflector including the third beam deflection system 030 and the fourth beam deflection system 040, the charged particle beam is made to pass the longitudinal magnetic field on a necessarily inclined trajectory.

For a dotted line 941 which is the projection of the trajectory of the charged particle beam shown on the XY-plane 971, the details will be described later referring to FIGS. 12 and 13.

For convenience sake of description, the equation of motion (Mathematical expression 4) of a charged particle in a magnetic field is decomposed in components in the directions of the x-axis, the y-axis and the z-axis and the components are expressed in Mathematical expression 12.

$$\left. \begin{array}{l} fx = qv_y Bz - qv_z By \\ fy = qv_z Bx - qv_x Bz \\ fz = qv_x By - qv_y Bx \end{array} \right\}$$ (Mathematical expression 12)

In the above expression, f denotes Lorentz force applied to the charged particle, q denotes charge, v denotes the velocity of the charged particle, B denotes a magnetic field and each subscript x, y, z denotes a component of each axis.

FIG. 11 will be described below on the supposition that the charged particle is an electron having negative charge e. To simplify, for a magnetic field, two components of Bz, Bx are considered. In a location apart from the optical axis, the existence of a component Br in a direction of a radius vector of a longitudinal magnetic field coil generates a component By in the direction of the y-axis as a result. If velocity when the charged particle beam is incident on a magnetic field applied region is v and v is composed of two components $v_z$ and $v_y$, rotation by $ev_y \cdot Bz$ in a positive direction of the x-axis, rotation by $ev_z \cdot By$ in a negative direction of the x-axis, rotation by $ev_z \cdot Bx$ in a positive direction of the y-axis and rotation by $ev_y \cdot Bx$ in a negative direction of the z-axis act in a position in which the charged particle beam is deflected again by the second beam deflection system 020 shown in FIG. 11 by Lorentz force and rotation acquired by synthesizing these is caused. Of these, the effect of the rotation by $ev_z \cdot Bx$ and $ev_y \cdot Bx$ is equivalent to displacement from the charged particle beam 920 to 910 in case there is no longitudinal magnetic field shown in FIG. 10. In a magnetic field by a normal magnetic lens, when the charged particle beam passes a longitudinal magnetic field, first, a velocity component $v_\theta$ rotated around the z-axis is generated by Lorentz force $ev_z \cdot Br$ based upon the magnetic field component Br in the direction of the radius vector on the upside of a coil and the velocity $v_z$ in the direction of the z-axis of the charged particle beam, centripetal force $ev_\theta \cdot Bz$ is generated by the rotational speed $v_\theta$ and the longitudinal magnetic field component Bz and the trajectory of the charged particle beam necessarily meets the optical axis even if the charged particle beam is rotated. This is the action of a lens and the effect of imaging is produced. In the meantime, a velocity component $v_y$ in this configuration is intentionally produced by the first beam deflection system 010 and the second beam deflection system 020, each point on the trajectory 910' receives Lorentz force in the direction of the x-axis "$ev_y \cdot Bz - ev_z \cdot By$" and 910' is not directed to a direction of the optical axis. That is, 910' does not converge on the optical axis. Above all, as described in relation to FIG. 6, in case the longitudinal magnetic field application coil 003 of the external magnetic field application system for a specimen 000 is composed of two coils 003$_1$ and 003$_2$, counterclockwise torque may be partially stronger depending upon the trajectory of the charged particle beam and the trajectory of the charged particle beam is complex. Further, as the velocity $v_y$ in the direction of the y-axis decreases by rotation by $ev_z \cdot Bx$, quantity returned by the horizontal magnetic field Bx is relatively short and as shown on the XY-plane 971 by the asterisk, 910' reaches the surface of the specimen before it reaches the x-axis.

Figure 12:
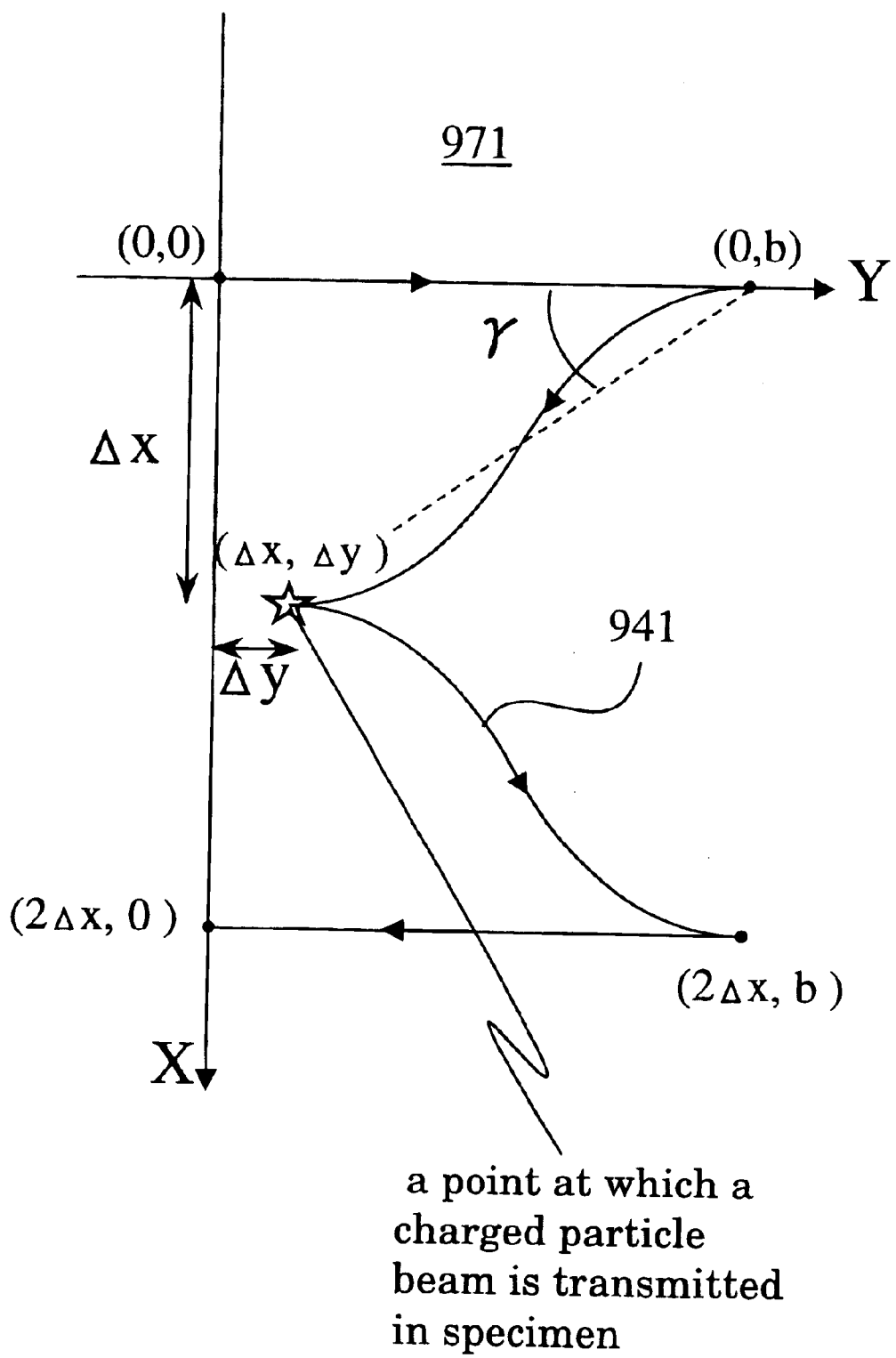
FIG. 12 is an explanatory drawing for explaining a projection showing the variation on an XY-plane of the charged particle beam shown in FIG. 11.

FIG. 12 is an explanatory drawing for explaining the projection 941 showing the variation from the charged particle beam 910 to 910' shown in FIG. 11 on the XY-plane 971. That is, the trajectory of the charged particle beam when deflection is made by the first to fourth beam deflection systems and the longitudinal magnetic field is applied to the specimen will be described according to the course of the charged particle beam below. As the effect of the longitudinal magnetic field is approximately zero to a position in which the charged particle beam is deflected again in a region by the second beam deflection system 020 where the beam is deflected in a positive direction of the y-axis by the first beam deflection beam, the charged particle beam is deflected along the y-axis. This is shown between coordinates (0, 0) and (0, b). It need scarcely be said that the coordinates (0, 0) denote the optical axis 900. Between the position in which the charged particle beam is deflected again by the second beam deflection system 020 and the external magnetic field application system for a specimen 000, as the longitudinal magnetic field is applied, the displacement by rotation of the trajectory is remarkable. This is shown by the trajectory between the coordinates (0, b) and (Δx, Δy). The rotation of the charged particle beam is the largest in a part from the second beam deflection system 020 to the external magnetic field application system 000 where the longitudinal magnetic field is relatively strong and the velocity component $v_y$ in the direction of the y-axis of the charged particle beam is large. As the velocity component $v_y$ in the direction of the y-axis becomes smaller near to the position of the specimen, that is, the XY-plane, the rotation of the charged particle beam also becomes smaller. Between the external magnetic field application system 000 and the third beam deflection system 030, as the velocity component $v_y$ in the direction of the y-axis is reversed with the XY-plane 971 between them, the direction of rotation is reversed. The trajectory symmetrical with the trajectory between the coordinates (0, b) and (Δx, Δy) is drawn between the coordinates (Δx, Δy) and coordinates (2Δx, b). The trajectory between the coordinates (2Δx, b) and coordinates (2Δx, 0) is drawn via the third beam deflection system 030. After the charged particle beam passes the fourth beam deflection system 040, it becomes parallel to the optical axis. However, the charged particle beam traces the trajectory displaced by 2Δx from the optical axis.

The actual situation of displacement from the optical axis caused by the rotation of the trajectory of the charged particle beam by the application of the longitudinal magnetic field is extremely complex, and the evaluation and the determination of correction factors by an actual system are essential, however, referring to FIG. 13, the basic procedure of a correcting method will be described below. The procedure is divided into the following four steps and for a concept, the charged particle beam is deflected by the first beam deflection system 010 beforehand so that the charged particle beam passes a specimen on the optical axis 900 (coordinates (0, 0) as shown in FIG. 13 and when the charged particle beam is deflected again by the second beam deflection system 020, it passes the optical axis 900. As described above, only the magnetic field Bx in the direction of the x-axis and the magnetic field Bz in the direction of the z-axis are considered below.

Step 1: A direction of deflection by the magnetic field Bx applied to the specimen is the direction of the y-axis, however, the charged particle beam is deflected by a half of a displacement angle γ caused by the rotation of a longitudinal magnetic field, that is, an angle γ/2 in a negative direction of the x-axis, that is, counterclockwise by the first beam deflection system 010 beforehand. The charged particle beam traces a trajectory from the coordinates (0, 0) to coordinates (−Δx/2, b−Δy) shown in FIG. 13.

Step 2: The charged particle beam is further deflected in the negative direction of the x-axis by the second beam deflection system 020. The velocity components $v_x$, $v_y$ in a horizontal direction of the particle beam are attenuated by rotation by the longitudinal magnetic field while the charged particle beam is transmitted between the second beam deflection system and the external magnetic field application system and become zero on the origin. That is, the charged particle beam is incident on the specimen along the optical axis. The trajectory is equivalent to a trajectory shown by a reference number 951 from the coordinates (−Δx/2, b−Δy) to the coordinates (0, 0) shown in FIG. 13.

Step 3: The same rotation as that between the second beam deflection system and the external magnetic field application system is also applied between the external magnetic field application system and the third beam deflection system. The trajectory is equivalent to a trajectory from the coordinates (0, 0) to the coordinates (Δx/2, b−Δy) shown in FIG. 13. The trajectory is symmetrical with the trajectory shown by the reference number 951.

Step 4: The charged particle beam is deflected again toward the positive direction of the x-axis between the third beam deflection system 030 and the fourth beam deflection system 040 so that it finally travels on the optical axis so as to negate displacement by extra rotation applied after the charged particle beam passes the specimen. The trajectory is equivalent to a trajectory from the coordinates (Δx/2, b−Δy) to the coordinates (0, 0) shown in FIG. 13.

In case a transverse magnetic field is applied in a horizontal arbitrary direction, the similar correction is enabled by regarding the direction of the transverse magnetic field as the direction of the x-axis and taking the same procedure.

The above procedure is based upon a principle based upon CFA and as the trajectory of the charged particle beam is different depending upon the magnitude and the direction of a magnetic field applied to a specimen by a beam deflection system such as an actual coil, the angle and the direction of each deflection by all beam deflection systems of the charged particle beam vary and fine control in the actual system is required. In addition to the fine control in each beam deflection system, a sub beam deflection system is useful to match the trajectory of the charged particle beam and the optical axis in a position where the specimen is located when magnetic fields are applied in all directions and the charged particle beam passes the magnetic fields.

Figure 14:
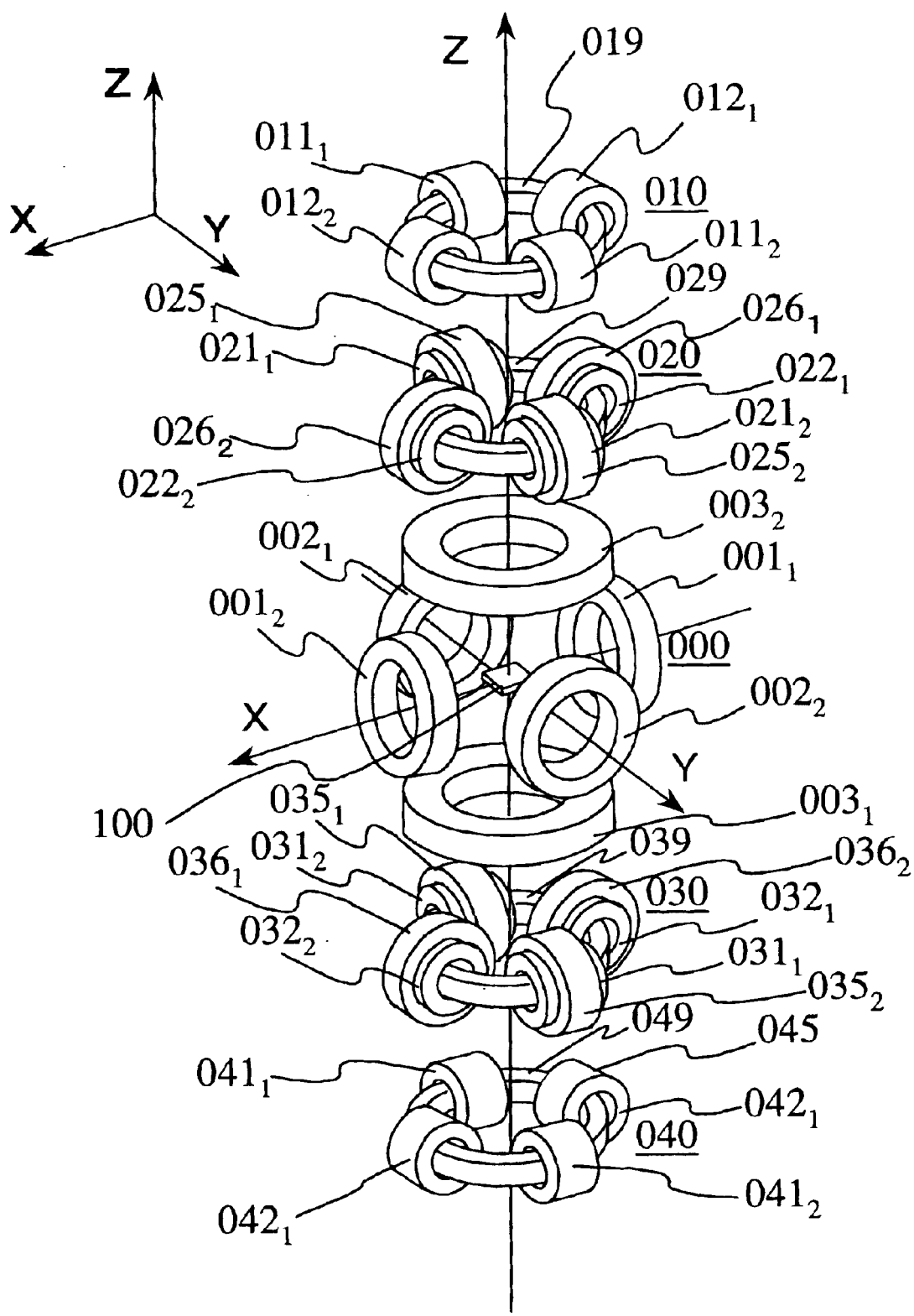
FIG. 14 schematically shows a concrete example in case a circular magnetic core made of magnetic material is provided to the first beam deflection system 010 to the fourth beam deflection system 040 of the specimen observation system for applying an external magnetic field and a sub-second beam deflection system and a sub-third beam deflection system are added in addition to each coil of the second and third beam deflection systems.

FIG. 14 schematically shows a concrete example of the specimen observation system for applying an external magnetic field in case a circular magnetic core made of magnetic material is provided to a first beam deflection system 010 to a fourth beam deflection system 040 and a sub-second beam deflection system and a sub-third beam deflection system are added to each coil of the second beam deflection system and the third beam deflection system, compared with that shown in FIG. 8. The same reference number is allocated to the same component or a component having the similar function as/to that in FIG. 8. In this example, as the first to fourth beam deflection systems are respectively composed of coils using circular magnetic material for the magnetic core, the required deflection angle of a charged particle beam is acquired even if the coils are small-sized and the number of turns is small or even if supplied current is small. The axis of the coils is not coincident with that in FIG. 8 and is along the magnetic core using circular magnetic material. Therefore, to deflect the charged particle beam in the direction of the x-axis by the first beam deflection system 010, a pair of coils $011_1$, $011_2$ located in the direction of the x-axis of the magnetic core 019 are excited and to deflect the charged particle beam in the direction of the y-axis by the first beam deflection system, a pair of coils $012_1$, $012_2$ located in the direction of the y-axis of the magnetic core are excited. The position of the excited coils is different from the case shown in FIG. 8. The description of the second beam deflection system 020 to the fourth beam deflection system 040 is omitted, however, the pair of coils having any equivalent to an axis to be deflected of magnetic cores 029 to 049 has only to be excited.

In addition to each coil of the second beam deflection system 020 and the third beam deflection system 030, sub-second beam deflection coils in the direction of the x-axis $025_1$, $025_2$, sub-second beam deflection coils in the direction of the y-axis $026_1$, $026_2$, sub-third deflection coils in the direction of the x-axis $035_1$, $035_2$ and sub-third beam deflection coils in the direction of the y-axis $036_1$, $036_2$ are arranged. Fine control over the quantity or the direction of the deflection of the charged particle beam 910 can be facilitated by using these together with the control of each coil of the second beam deflection system 020 and the third beam deflection system 030.

Sub beam deflection coils can be also provided in FIG. 8 as described in relation to FIG. 14 though they are not described in relation to FIG. 8 and it need scarcely be said that they can be also effectively used in the configuration shown in FIG. 8.

The outline of a method of adjusting the optical axis of an electron beam in case each beam deflection system and the external magnetic field application system for a specimen respectively described in relation to FIG. 8 are arranged between a condenser optical system and a magnifying/imaging system in the system according to the invention applied to an electron microscope will be described below. The description will be made on the supposition that sub beam deflection systems 025, 026, 035, 036 are provided to a second beam deflection system 020 and a third beam deflection system 030. As a result, 15 pairs of thirty coils exist. For convenience sake of description, as shown in FIG.

4, a space coordinate system is determined. That is, the z-axis is determined in a direction parallel to the optical axis and reverse to a direction in which the electron beam travels, and the x-axis and the y-axis are determined in two directions perpendicular to the z-axis. These coordinate axes are the same as those shown in FIG. 9. For convenience sake of notation when a magnetic field is applied, a spherical coordinate system (B, θ, Ψ) is also shown. In the spherical coordinate system, B denotes the magnitude of magnetic flux density applied to a specimen, θ denotes an angle of rotation (counterclockwise: positive) in an XY-plane from the x-axis in the horizontal direction, Ψ denotes an angle between the z-axis and the bearing of an applied magnetic field and relation with a rectangular coordinate system is as described in Mathematical expression 3.

First, as a premise, relation between the quantity of current applied to the coil and generated magnetic field intensity is measured beforehand before the system according to the invention is built in the electron microscope. That is, the relation in Mathematical expression 2 is made clear for all coil pairs. Distance between each beam deflection system and distance between the beam deflection system and the external magnetic field application system are made clear beforehand, the intensity of a magnetic field applied to the specimen and basic magnetic field intensity to be output by each beam deflection system corresponding to the above intensity are made clear, and it is known that they are "1:−2:2:−2:1" for example as described in relation to FIG. 3.

A case that a transverse magnetic field is applied in the direction of the x-axis will be described below. A longitudinal magnetic field is zero.

(1) First, the optical axis of the electron microscope is adjusted as usual.

(2) A characteristic to be a marker is found on the specimen by focusing on the specimen and the marker is arranged in the center of a fluorescent screen and in the center of a beam spot that irradiates the fluorescent screen.

(3) Afterward, until the adjustment of the axis of the external magnetic field application system is finished, the minute movement of the specimen is not made. The readjustment of a condenser optical system is also not made.

(4) The increase/decrease (under- and over-focusing) of lens current for a first imaging lens (normally, an objective) is repeated and it is verified that a beam spot is concentrically magnified/reduced.

(5) A transverse magnetic field in the direction of the x-axis is applied. That is, current Ix to an external magnetic field application coil is increased. Note that in case a magnetic field is applied in the direction of the x-axis, an electron beam is deflected in the direction of the y-axis because of the character of Lorentz force.

(6) The beam spot is magnified/reduced by the increase/decrease of current for the first imaging lens, being shaken crosswise (because the electron beam is diagonally incident on the lens).

(7) A front beam deflector and a rear beam deflector are excited by suitable quantity so that the shake of the beam spot is small and only a component in the direction of the x-axis (a direction perpendicular to a direction shaken by the application of Ix) exists. The component of deflection in the direction of the x-axis also depends upon the processing accuracy of all beam deflection systems and the external magnetic field application system, however, the component is made by a longitudinal magnetic field component caused in the rear beam deflector and the rear beam deflector.

(8) At this time, the position of the beam spot is off the center of the fluorescent screen and the position of the marker on the specimen is also off the center of the beam spot.

(9) The sub beam deflection systems 025, 026, 035, 036 are adjusted so that the beam spot is concentrically magnified/reduced in the center of the fluorescent screen. At this time, the marker on the specimen is adjusted so that it is located in the center of the spot.

For the guideline of the step described in (9), (i) first, quantity in which a pair of front and rear sub beam deflection systems (025, 035) and a pair of front and rear sub beam deflection systems (026, 036) are respectively excited is equalized.

(ii) In case quantity in which the front and rear sub beam deflection systems 025, 035 in the direction of the x-axis are excited is increased, Ix is also increased.

(iii) At the stage of final adjustment, a constraint that the pair of front and rear sub beam deflection systems (025, 035) and the pair of front and rear sub beam deflection systems (026, 036) are equally excited is released and the beam spot and the marker on the specimen are adjusted more precisely.

(iv) The front sub-second beam deflection system is used for moving the beam spot and the rear sub-third beam deflection system is used for moving the spot and the marker.

(10) It is verified that the magnification/reduction of the beam spot and the marker is made in the center of the fluorescent screen by increasing/decreasing current for exciting the first imaging lens (changing).

(11) The steps (7) to (9) are repeated until the step (10 is met.

(12) When the step (10) is met, the adjustment of the axis in a magnetic field applied to the specimen is finished. At this stage, the quantity of current for exciting each beam deflection system and the external magnetic field application system is recorded. Note as described in the step (9) (ii) that Ix is different from an initial value.

(13) The steps (5) to (12) are repeated, varying applied magnetic field intensity.

(14) The application of a magnetic field in the direction of the y-axis is also similarly adjusted.

(15) For an angle between the x-axis and the y-axis, the beam deflection systems in both directions of the x-axis and the y-axis are required to be excited, however, steps are similar.

(16) In case a magnetic field in the direction of the z-axis is applied, deflection for returning in consideration of rotation by the longitudinal magnetic field as described above is required, however, steps are similar.

As described above, a magnetic field of various intensity in various directions is applied and in each case, each beam deflection system is adjusted.

Such adjusted relation produces a situation that guarantees that when a magnetic field applied to the specimen is varied, a charged particle beam passes on the optical axis and is applied to the specimen in parallel with the optical axis, however, control over magnetic field intensity by the front beam deflector and the rear beam deflector when a longitudinal magnetic field is varied will be described below, referring to FIGS. 15 and 16. In normal observation, the displacement from the optical axis of a charged particle beam is not required to be considered by setting this relation in the computer 310.

Figure 15:
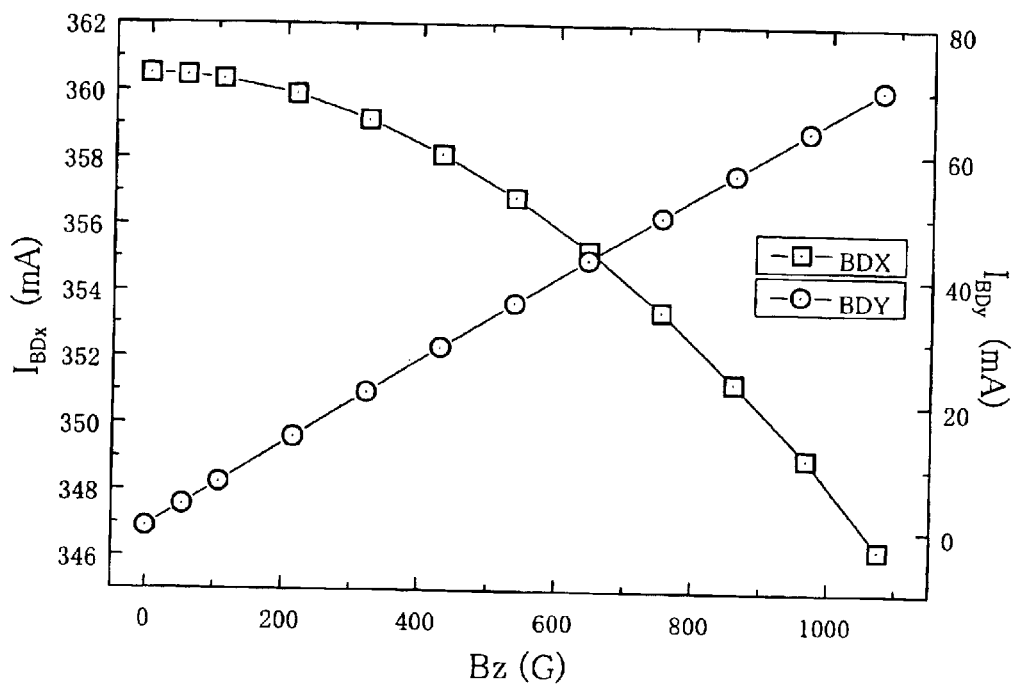
FIG. 15 shows the result of measuring the intensity (required to keep a point at which a beam is incident on a specimen at coordinates (0, 0) even if longitudinal magnetic field intensity by the external magnetic field application system is varied) of a magnetic field in a direction of the x-axis and a magnetic field in a direction of the y-axis respectively generated by front and rear beam deflectors as a current value.

FIG. 15 shows the result of measuring the intensity (required to keep a point at which a charged particle beam is transmitted in specimen at coordinates (0, 0) even if longitudinal magnetic field intensity by the external magnetic field application system is varied) of a magnetic field in the direction of the x-axis and a magnetic field in the direction of the y-axis by the front and rear beam deflectors as a current value. This example shows the quantity of current $I_{BDX}$ (mA) for exciting the front and rear beam deflectors in the direction of the x-axis and the quantity of current $I_{BDY}$ (mA) for exciting the front and rear beam deflectors in the direction of the y-axis, which is required to keep the point at which the charged particle beam is transmitted in the specimen at the coordinates (0, 0) when the quantity of current for exciting a longitudinal magnetic field application coil of the external magnetic field application system is varied and longitudinal magnetic field intensity is varied in a state in which a transverse magnetic field is applied in the direction of the x-axis by 94 G (=9.4 mT) (500 mA). For example, if longitudinal magnetic field intensity is 500 G (=50 mT), the quantity of current $I_{BDX}$ for exciting the beam deflector in the direction of the x-axis is 358 (mA) and the quantity of current $I_{BDY}$ for exciting the beam deflector in the direction of the y-axis is 33 (mA) to keep the point at which the charged particle beam is transmitted in the specimen at the coordinates (0, 0). If longitudinal magnetic field intensity is 600 G (=60 mT), the quantity of current $I_{BDX}$ for exciting the beam deflector in the direction of the x-axis is 356 (mA) and the quantity of current $I_{BDY}$ for exciting the beam deflector in the direction of the y-axis is 48 (mA) to keep the point at which the charged particle beam is transmitted in the specimen at the coordinates (0, 0). As shown in FIG. 15, $I_{BDX}$ shows a tendency of decrease by a cosine function and $I_{BDY}$ shows a tendency of increase by a sine function.

If such characteristics are measured for not only a transverse magnetic field in the direction of the x-axis but a transverse magnetic field in the direction of the y-axis, a range of the suitable intensity of a transverse magnetic field in a range required for observation is measured and is set in the computer 310, the computer 310 automatically sets the quantity of current $I_{BDX}$ (mA) for exciting the front and rear beam deflectors in the direction of the x-axis and the quantity of current $I_{BDY}$ (mA) for exciting the front and rear beam deflectors in the direction of the y-axis by only setting the intensity of a magnetic field applied to the specimen in observation. Needless to say, as the measurement of data can be complemented, it need scarcely be said that setting a reasonable numerical value and measurement are compatible.

In the above example, the quantity of current for exciting the front beam deflector and the quantity of current for exciting the rear beam deflector are equal, however, this reason is that the working accuracy of the front and rear beam deflectors is satisfactory and the symmetry property is satisfactory. When the symmetry property is not satisfactory, measurement every beam deflector is required. The reason why coils of the front beam deflector and coils of the rear beam deflector are controlled by different power supplies in the description of examples for the connection of coils shown in FIGS. 18 and 19 and described later is that the above is considered. In the above example, no sub beam deflection system is referred, however, as also known from the description of the outline of the method of adjusting the optical axis of an electron beam, it need scarcely be said that the best result of the adjustment of the optical axis should be acquired also using sub beam deflection systems.

Figure 13:
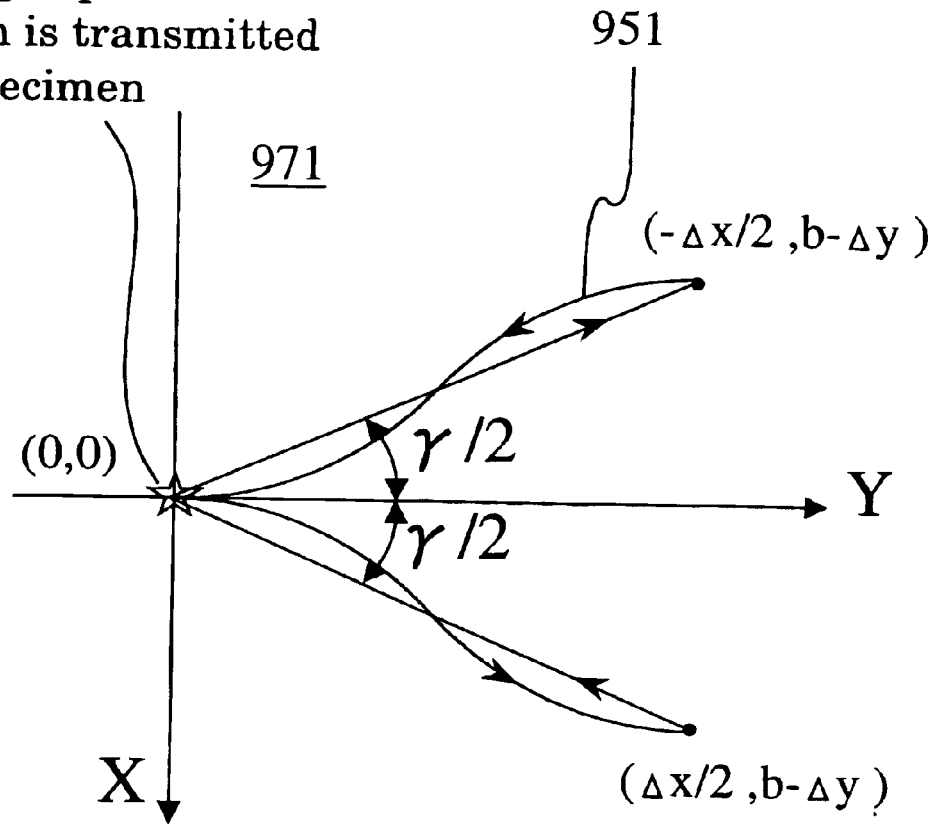
FIG. 13 is an explanatory drawing for explaining a basic procedure of a method of correcting the displacement caused by the rotation of a charged particle beam by a longitudinal magnetic field applied to a specimen from the optical axis of the trajectory.
Figure 16:
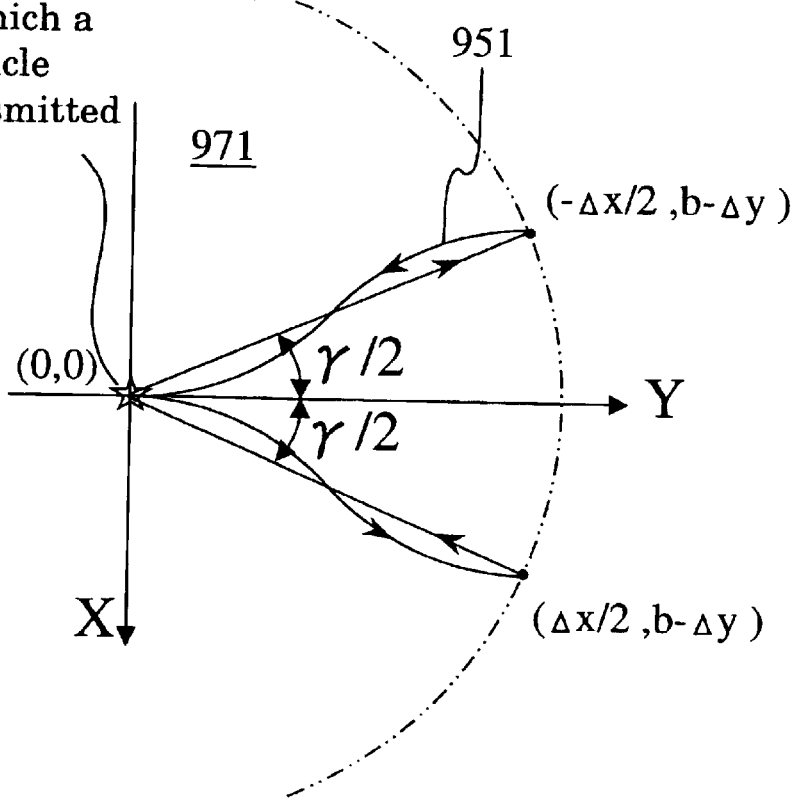
FIG. 16 shows the variation of the trajectory shown in FIG. 13 when the intensity of a longitudinal magnetic field by the external magnetic field application system is varied.

FIG. 16 shows the variation of the trajectory shown in FIG. 13 when longitudinal magnetic field intensity by the external magnetic field application system is varied. As described in relation to FIG. 15, if the intensity of a magnetic field in the direction of the x-axis and a magnetic field in the direction of the y-axis by the front and rear beam deflectors is varied corresponding to the following variation when longitudinal magnetic field intensity by the external magnetic field application system for a specimen is varied, the charged particle beam can be transmitted in the specimen at the coordinates (0, 0), however, when the variation of coordinates at this time is checked, it is verified that the coordinates ($-\Delta x/2$, b$-\Delta y$) and the coordinates ($\Delta x/2$, b$-\Delta y$) of the trajectory shown in FIG. 13 are substantially located on a circumference shown by an alternate long and two short dashes line and having the coordinates (0, 0) in the center. This corresponds to FIG. 15 in which $I_{BDX}$ shows a tendency of decrease by the cosine function and $I_{BDY}$ shows a tendency of increase by the sine function.

As known from the above, a system in which when a magnetic field applied to the specimen and the bearing are determined by describing current for exciting each beam deflection system as a function of a component (B, θ, Ψ) for exciting the external magnetic field application system or exciting current (Ix, Iy, Iz) and inputting the current for exciting each beam deflection system to the computer 310 for controlling each power supply 200 described in relation to FIG. 4, the current for exciting each beam deflection system is uniquely determined can be configured.

The examples that the air-core coils are used for the first to fourth beam deflection systems are mainly described above, however, in the invention, the beam deflection systems 010, 020, 030, 040 before and after the specimen are not necessarily required to be composed of the same type of air-core coils as the external magnetic field application system shown in FIG. 8 and the magnetic material shown in FIG. 14 such as iron may be also used for a core. In the configuration shown in FIG. 14, the quantity of deflection of the charged particle beam is not linear for excitation by current, however, as a stronger magnetic field is acquired than the air-core coil in the same number of turns, the size can be reduced.

Figure 17:
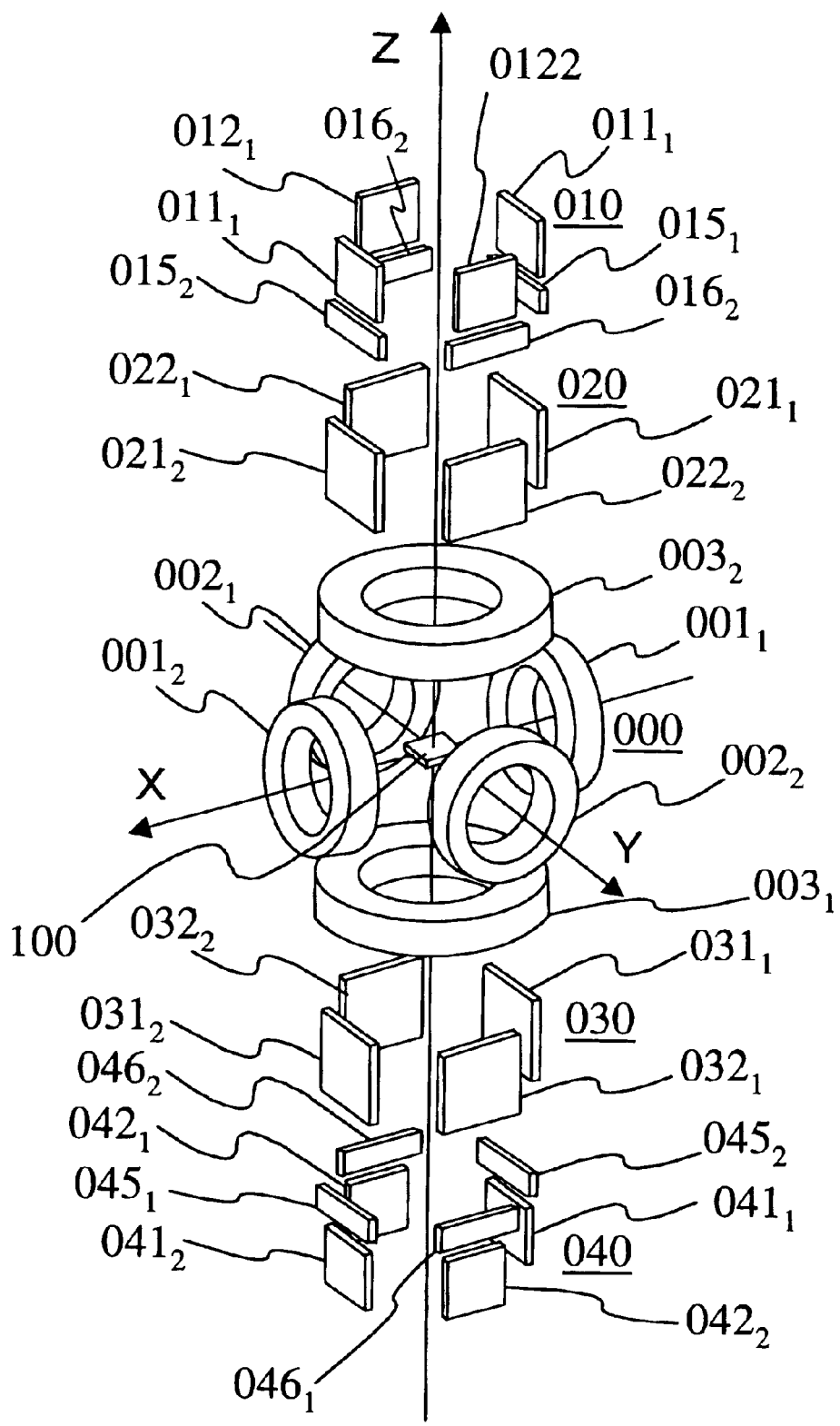
FIG. 17 is a schematic drawing showing the details of a concrete example when first to fourth beam deflection systems of a specimen observation system for applying an external magnetic field generate an electric field and an external magnetic field application system for a specimen is composed of air-core coils.

Further, as shown in FIG. 17, beam deflection systems depending upon an electric field may be also provided. As in FIG. 17, electrode plates for generating an electric field correspond to the coils shown in FIG. 9, the reference number allocated to each beam deflection system shown in FIG. 9 is also allocated to that in FIG. 17. In FIG. 17, electrodes plates $015_1$, $015_2$, $016_1$, $016_2$ and $045_1$, $045_2$, $046_1$, $046_2$ additionally provided to the first beam deflection system and the fourth beam deflection system are a sub beam deflecting plate and as described in relation to FIG. 10, the quantity of deflection is additionally increased. In this case, it is required to be noted that the arrangement of beam deflection systems used for deflection and a direction in which the charged particle beam is deflected are different in each configuration, however, as there is no difference in a function, the further description is omitted.

Next, a concrete example of controlling total 30 coils including coils of sub beam deflection systems by plural power supplies will be described. For the number of required power supplies, in an extreme case, total 30 power supplies are required on the supposition that all coils are independently controlled, however, if symmetrical deflection is basically made above and below the specimen in consideration of the symmetry of the arrangement of each beam deflection system, control is enabled by 5 to 11 power supplies according to conditions for control. Table 1 shows these conditions for control and relation in connection between power supplies and coils.

TABLE 1

| External magnetic field application system for specimen and beam deflection systems | Direction | Working condition | | | | |
|---|---|---|---|---|---|---|
| | | (1) Case of using similar coils or beam deflection calibrated coils without compensation of beam trajectory rotation | (2) Case of using similar coils or beam deflection calibrated coils with compensation of beam trajectory rotation | (3) Case of independent control of external magnetic field application system for specimen under the condition (2) | (4) Case of independent control for first-and second-beam deflection system pair and third- and fourth-beam deflection system pair under the condition (3) | (5) Case of control whole beam deflection system independently |
| First beam deflection system | X<br>Y | A<br>B | A<br>B | A<br>B | A<br>B | ⊙<br>⊙ |
| Second beam deflection system | X<br>Y | A<br>B | A<br>B | A<br>B | A<br>B | ⊙<br>⊙ |
| Sub-second beam deflection system | X<br>Y | D<br>E | D<br>E | D<br>E | D<br>E | —<br>— |
| External magnetic field application system for specimen | X<br>Y<br>Z | A<br>B<br>C | A<br>B<br>C | H<br>I<br>C | H<br>I<br>C | ⊙<br>⊙<br>⊙ |
| Sub-third beam deflection system | X<br>Y | D<br>E | F<br>G | F<br>G | F<br>G | —<br>— |
| Third beam deflection system | X<br>Y | A<br>B | A<br>B | A<br>B | J<br>K | ⊙<br>⊙ |
| Fourth beam deflection system | X<br>Y | A<br>B | A<br>B | A<br>B | J<br>K | ⊙<br>⊙ |
| Total number of power supply for necessity | | A~E<br>5 | A~G<br>7 | A~I<br>9 | A~K<br>11 | 11 |

In Table 1, power supplies for generating magnetic fields in the direction of the x-axis, in the direction of the y-axis and in the direction of the z-axis every beam deflection system are shown by characters A to K and according to the working conditions of the system, a state in which the system is used in series is shown based upon connection. Power supplies independently used are shown by a double circle. For example, as shown in a field of a condition (1), the number of turns and the diameter of a coil in each beam deflection system and distance between coils are selected so that the efficiency of the deflection of a charged particle beam is predetermined quantity, in case the compensation of rotation by a longitudinal magnetic field is not required, a power supply A is used for coils for generating a magnetic field in the direction of the x-axis in the first beam deflection system, the second beam deflection system, the external magnetic field application system for a specimen, the third beam deflection system and the fourth beam deflection system, and the coils of each beam deflection system shall be all connected in series. A power supply B is similarly used for coils for generating a magnetic field in the direction of the y-axis in the first beam deflection system, the second beam deflection system, the external magnetic field application system, the third beam deflection system and the fourth beam deflection system and the coils of each beam deflection system shall be all connected in series. Coils for generating a magnetic field in the direction of the z-axis in the external magnetic field application system are independently driven by a power supply C. A power supply D is used for coils for generating a magnetic field in the direction of the x-axis in the sub-second beam deflection system and the sub-third beam deflection system and the coils of each beam deflection system shall be all connected in series. A power supply E is similarly used for coils for generating a magnetic field in the direction of the y-axis in the sub-second beam deflection system and the sub-third beam deflection system and the coils of each beam deflection system shall be all connected in series. Therefore, under this condition, the number of required power supplies is five at the minimum.

Generally, the compensation of the rotation of a charged particle beam by a longitudinal magnetic field applied to a specimen is impossible in case the excitation of the sub-second beam deflection system and the sub-third beam deflection system is vertically symmetrical. Therefore, in case the compensation of the rotation is considered, a common power supply cannot be used for both as shown in the condition (1), a power supply D independent for the x-axis and the y-axis is required to be used for a sub-second beam deflection power supply and a power supply G independent for the x-axis and the y-axis is required to be used for a sub-third beam deflection power supply. This is shown in a condition (2).

In a field of a condition (3), a case that only the external magnetic field application system is controlled by a power supply independent not only in the direction of the z-axis but in the direction of the x-axis and in the direction of the y-axis is shown. Under this condition, therefore, power supplies H and I are required. As a result, total nine power supplies are required. For example, as shown in FIG. 14, in case different types of coils are used for the beam deflection systems and for the external magnetic field application system, it is required that the system is operated under the condition (3).

In a field of a condition (4), an example that a pair of the first beam deflection system and the second beam deflection system and a pair of the third beam deflection system and the fourth beam deflection system under the condition (3) are controlled by separate power supplies is shown. That is, under the condition (3), both pairs have only to be provided with the power supply A for coils for generating a magnetic field in the direction of the x-axis and the power supply B for coils for generating a magnetic field in the direction of the y-axis, however, under the condition (4), as power supplies J, K for the pair of the third beam deflection system and the fourth beam deflection system are required, total 11 power supplies are required.

In a field of a condition (5), an example that each beam deflection system and the external magnetic field application system are independently controlled to deflect a charged particle beam most simply and arbitrarily is shown. As hereby, a sub beam deflection system is not required, control is enabled by 11 power supplies as in the condition (4). As there is no connection between beam deflection systems, the allocation of a reference number to a power supply is omitted.

The beam deflection systems in the specimen observation system for applying an external magnetic field are provided to vary an angle with the optical axis of a charged particle beam. Therefore, in case noise enters the body of a power supply, a cable connecting the power supply and a coil and the coil, the noise causes the deflection of the charged particle beam and the deterioration of resolution in observation or the deterioration of the processing accuracy of processing by the charged particle beam is caused. The effect of noise in an electron microscope is estimated. It is supposed that the external magnetic field application system can apply a magnetic field of 20 mT (millitesla) when the quantity of current for exciting coils for the direction of the x-axis and for the direction of the y-axis is 1 A. An angle at which an electron beam (accelerating voltage: 1 MV) is deflected is $8.5 \times 10^{-2}$ rad (=4.8°) in a rough estimate based upon CFA (the thickness of a magnetic field in the direction of a charged particle beam is set to 20 mm). As an angle at which an electron beam is deflected by a fluxoid quantum described later of a specimen is estimated to be approximately $1 \times 10^{-6}$ rad, the fluctuation of the angle of the electron beam is required to be approximately $1 \times 10^{-7}$ rad or less. That is, stability required for the external magnetic field application system is $1 \times 10^{-6}$ A or less and the highest level of the current technology is required.

Under such a condition, a noise killing measure by using a stable power supply and a shielded cable is one of important measures, however, it is desired that the effect of noise is also reduced by optimizing a method of connecting a coil. From such a viewpoint, a method of connecting a coil will be described below.

To evaluate the effect of noise upon a charged particle beam, first, referring to FIG. 18, a method of connecting a power supply and a beam deflection system in case all beam deflection systems and the external magnetic field application system can be independently controlled using 11 power supplies (a condition (5) in Table 1) will be described below. In FIG. 18, for convenience sake of construction, a beam deflection system and the external magnetic field application system are represented by one coil and a magnetic field generated by the coil is shown as BD1 to DB4 and BD0 as shown in FIG. 11. Only either of the direction of the x-axis or the direction of the y-axis is considered. Power supplies for supplying current to the coils of the beam deflection system and the external magnetic field application system are shown as 211, 221, 231, 241 and 201. The same type of coils are used for each beam deflection system and the external magnetic field application system and as described in relation to FIG. 11, a case in which distance between each beam deflection system and distance between each beam deflection system and the external magnetic field application system are equalized is supposed. For the number of turns, the number of turns of coils of the first beam deflection system 010 is set to N, that of the second beam deflection system is set to 2N, that of the external magnetic field application system is set to 2N, that of the third beam deflection system is set to 2N and that of the fourth beam deflection system is set to N. Each coil is independently excited by the same type of power supply. As noise that emerges as the fluctuation angle of a charged particle beam by each coil is proportional to the number of turns of the coil as described later, noise by a coil of the number of turns of 2N is $2\delta\alpha$ when noise by a coil of the number of turns of N is represented as $\delta\alpha$. As the direction of noise corresponds to the bearing of a magnetic field, noise in case a magnetic field is applied as shown in FIG. 11 has polarity shown in FIG. 11. In this case, when current flows into a coil from the upside to the downside in the drawing, polarity in which the magnetic field BD1 described in relation to FIG. 11 is generated is set as positive. Therefore, the power supply 211 for exciting the coils in the first beam deflection system 010 is positive and the power supply 221 for exciting the coils in the second beam deflection system 020 is negative. Similarly, the power supply 201 for the external magnetic field application system is positive, the power supply 231 for the third beam deflection system is negative and the power supply 241 for the fourth beam deflection system is positive. As in FIG. 18, only either of the direction of the x-axis or the direction of the y-axis is shown, five pairs of coils and power supplies for the configuration of beam deflection systems in directions different by 90 degrees horizontally and further, a pair of coils and power supply for applying a magnetic field in the direction of the z-axis to a specimen are actually required. In this case, a longitudinal magnetic field parallel to a charged particle beam is omitted because the longitudinal magnetic field has a small effect upon the trajectory of the charged particle beam.

Noise which the body of the power supply and the cable receive or which is caused in the location is equivalent to the variation $\delta I$ of current that flows in a coil, this causes the variation $\delta B$ of a magnetic field according to the relation shown in Mathematical expressions 1 and 2 and finally, a charged particle beam is deflected by a deflection angle $\alpha$ as shown in Mathematical expression 7. In case the same noise $\delta I$ is input, the fluctuation angle is proportional to the number N of turns of the coil as shown in Mathematical expression 1. When the above relation is represented on the supposition that the fluctuation angle of the charged particle beam caused in the coil of the number of turns of N is $\delta\alpha$, Mathematical expression 13 is acquired.

$$\delta\alpha \propto \delta B \propto N \times \delta I \qquad \text{(Mathematical expression 13)}$$

That is, in case the number of turns of coil in each beam deflection system is determined as described above, for the quantity of the fluctuation caused in each beam deflection system of the charged particle beam, the first beam deflection system is $\delta\alpha$, the second beam deflection system is $-2\delta\alpha$, the external magnetic field application system is $2\delta\alpha$, the third beam deflection system is $-2\delta\alpha$ and the fourth beam deflection system is $\delta\alpha$.

The total fluctuation angle $\Sigma\delta\alpha$ of the charged particle beam is equivalent to the square root of the sum of squares of each fluctuation angle. Therefore, a case shown in FIG. 18 is represented as in Mathematical expression 14.

$$\Sigma\delta\alpha = \sqrt{(\delta\alpha)^2 + (-2\delta\alpha)^2 + (2\delta\alpha)^2 + (-2\delta\alpha)^2 + (\delta\alpha)^2} \qquad \text{(Mathematical expression 14)}$$
$$= 3.74 \times \delta\alpha$$

In the meantime, FIG. 19 shows an example of a method of connecting coils in which noise is minimum in the configuration of beam deflection systems and others shown in the condition (4) in Table 1. In FIG. 19, coils are also drawn in a state in which they are simplified as in FIG. 18 and the structure of coils of each beam deflection system and the external magnetic field application system is the same as that in FIG. 18. In FIG. 19, a sub-second beam deflection coil and a sub-third beam deflection coil are provided and sub-magnetic fields BD2a and BD3a are generated. The coils (the number of turns N) of the first beam deflection system 010 and the coils (the number of turns 2N) of the second beam deflection system 020 are connected in series so that respective magnetic fields are generated in reverse directions and are excited by one power supply 215. The sub-second beam deflection coil (the number of turns N/4) is excited by a power supply 227 and the sub-magnetic field BD2a is generated. The coils (the number of turns 2N) of the third beam deflection system 030 and the coils (the number of turns N) of the fourth beam deflection system 040 are similarly connected in series so that respective magnetic fields are generated in reverse directions and are excited by one power supply 235. The sub-third beam deflection coil (the number of turns N/4) is excited by a power supply 237 and the sub-magnetic field BD3a is generated.

FIG. 19 shows that the sub-magnetic fields BD2a and BD3a are generated by the sub-second beam deflection coil and the sub-third beam deflection coil in the bearing of the magnetic field BD1, however, they can be also generated in a reverse direction. Deflection corresponding to the ratio of the number of turns of the coil of the first and second beam deflection systems to that of the coil of the third and fourth beam deflection systems can be changed to the arbitrary ratio of excitation by providing the sub beam deflection coils. The number of turns of the sub coil is N/4 in the above case, however, the number of turns can be arbitrarily selected depending upon the quantity to be additionally compensated of deflection of a charged particle beam. It need scarcely be said that the quantity of deflection can be controlled by current supplied to the coil.

According to connection shown in FIG. 19, the total fluctuation angle $\Sigma\delta\alpha$ of a charged particle beam is acquired in Mathematical expression 15 as in Mathematical expression 14.

$$\Sigma\delta\alpha = \sqrt{(\delta\alpha - 2\delta\alpha)^2 + \left(\frac{1}{4}\delta\alpha\right)^2 + (2\delta\alpha)^2 + (\delta\alpha - 2\delta\alpha)^2 + \left(\frac{1}{4}\delta\alpha\right)^2}$$ (Mathematical expression 15)

$$= 2.47 \times \delta\alpha$$

That is, it is verified that compared with the connection shown in FIG. 18, the system using the sub beam deflection systems is stronger by approximately 1.5 times for the fluctuation by noise of a charged particle beam, the fluctuation angle of an electron beam (1 MV) is controlled so that it is approximately $1\times10^{-7}$ rad or less and the observation of a fluxoid quantum is not hindered.

Table 2 shows magnetic field intensity which can be generated on the optical axis by the external magnetic field application system, a deflection angle of an electron beam of 1 MV at that time and an example of controllable minimum resolution.

The unit of each data in Table 2 is as follows. The unit of maximum current for magnetic field generation is an ampere (A), the unit of power supply stability is an ampere (A), the unit of a maximum applied magnetic field is millitesla (mT), the minimum angle for control is $1\times10^{-4}$ mT and the minimum angle resolution for an applied magnetic field is $1\times10^{-4}$ rad.

TABLE 2

| Coils and power supply | Direction | Maximum current for magnetic field generation (A) | Power supply stability (A) | Turn number of magnetic coil (T) | Maximum applied magnetic field (mT) | Minimum magnetic field for control ($\times10^{-4}$ mT) | Angle resolution for allied magnetic field ($\times10^{-4}$ rad) |
|---|---|---|---|---|---|---|---|
| First beam deflection | X | ±1 | <5 × 10$^{-6}$ | 200 | 12.4 | 7.57 | θ Direction |
| system | Y | ±1 | <5 × 10$^{-6}$ | 200 | 12.4 | 7.57 | 0.60 |
| Second beam | X | ±1 | <1 × 10$^{-6}$ | 400 | 22.8 | 13.92 | θ Direction |
| deflection system | Y | ±1 | <1 × 10$^{-6}$ | 400 | 22.8 | 13.92 | 0.61 |
| Sub-second beam | X | ±1 | <5 × 10$^{-6}$ | 80 | 4.9 | 2.99 | θ Direction |
| deflection system | Y | ±1 | <5 × 10$^{-6}$ | 80 | 4.9 | 2.99 | 0.61 |
| External magnetic | X | ±1 | <1 × 10$^{-6}$ | 1050 | 18.8 | 11.47 | θ: 0.61 |
| field application | Y | ±1 | <1 × 10$^{-6}$ | 1050 | 18.8 | 11.47 | φ: 0.11 |
| system for specimen | Z | ±1 | <1 × 10$^{-6}$ | 4000 | 107.5 | 8.20 | |
| Third beam | X | ±1 | <1 × 10$^{-6}$ | 400 | 22.8 | 13.92 | θ Direction |
| deflection system | Y | ±1 | <1 × 10$^{-6}$ | 400 | 22.8 | 13.92 | 0.61 |
| Sub-third beam | X | ±1 | <5 × 10$^{-6}$ | 80 | 4.9 | 2.99 | θ Direction |
| deflection system | Y | ±1 | <5 × 10$^{-6}$ | 80 | 4.9 | 2.99 | 0.61 |
| Fourth beam | X | ±1 | <5 × 10$^{-6}$ | 200 | 12.4 | 7.57 | θ Direction |
| deflection system | Y | ±1 | <5 × 10$^{-6}$ | 200 | 12.4 | 7.57 | 0.60 |

Next, the arrangement of the external magnetic field application system for a specimen will be concretely described. The external magnetic field application system is installed in a vacuum of a charged particle beam apparatus such as an electron microscope and normally, the internal volume is not so much. Therefore, the miniaturization is required. In the meantime, when the application of a strong magnetic field to a specimen is tried, relative generated magnetic field intensity for current has a rather small value, compared with a case that magnetic material is used in case an air-core coil is supposed as a measure against hysteresis. To increase generated magnetic field intensity with the air-core coil, the number of turns of the coil is required to be increased and space is scrambled by coils in three directions of the x-axis, the y-axis and the z-axis.

Therefore, as described in relation to FIG. 5, the first to fourth beam deflection systems and the external magnetic field application system for a specimen are built in the body of the charged particle beam apparatus, the resistance of the coils is reduced by cooling the region and the supply of sufficient current is enabled with the small structure. In case a cooling function is enough, a part of or all coils can be made of superconductive wire material, they are cooled up to superconductive transition temperature or lower to turn substantial resistance to zero and the system according to the invention can be operated as structure in which heavy-current can be made to flow, compared with the thickness of the wire. In the basic structure related to cooling coils made of superconductive wire material, as disclosed in a paper (K. Harada et al., Jpn. J. Appl. Phys. Vol. 33 (1994) 2534; p. 2536 FIG. 3), coil wire material can be cooled up to superconductive transition temperature or lower by connecting each coil to another refrigerator via metallic material having satisfactory thermal conductivity. To prevent the quenching of the superconductive wire material by excitation, the wire material is made in contact with the metallic material having satisfactory thermal conductivity by low temperature varnish. As a phenomenon that a magnetic flux is trapped in superconductive wire material occurs in case the coil is made of superconductive wire material, a superconductive state is required to be temporarily broken by heating the coil up to superconductive transition temperature or higher or making heavy-current to flow to intentionally cause quenching so as to remove the phenomenon and the function is provided.

As residual gas in a vacuum is absorbed in the internal wall of the external magnetic field application system in case the whole of the first to fourth beam deflection systems and the external magnetic field application system is cooled up to very low temperature of 5 k or less, the degree of vacuum around a specimen reaches so-called ultra-high vacuum. Therefore, the contamination of the specimen by the absorption of residual gas is reduced and for the observation and the processing of a specimen requiring high vacuum, the cooling power is effective. As the periphery of the specimen is cooled up to very low temperature, there is little thermal radiation from the periphery of the specimen to the specimen and the structure suitable for observation and processing using a very low specimen holder is acquired.

As described above, according to the invention, magnetic fields in all directions can be applied to a specimen and the charged particle beam optical system can be prevented from having an effect upon the bearings and the intensity of magnetic fields applied to the specimen. That is, a position and an angle where a charged particle beam irradiates the specimen can be kept fixed. Utilizing the characteristics, the following application is enabled.

(1) Evaluating Characteristic of Magnetic Shield

A magnetic shield is made of magnetic material having high magnetic susceptibility such as a permalloy and is used for a magnetic resonance imaging system and a magnetic head of a data recording apparatus for a floppy disk and a magnetic tape in addition to an electron microscope, however, the shielding characteristic of the magnetic material is often estimated and evaluated based upon the result of measurement in a macro state in an apparatus such as SQUID. In case the system according to the invention is mounted in an electron microscope, effective observation and evaluation in relation to a characteristic depending upon the shape of shielding material, above all, a local shielding characteristic are enabled. That is, a film provided with predetermined curvature is arranged in a position of a specimen and a leakage flux from a curved part is observed. It can be measured by varying the direction and the intensity of a magnetic field applied to a curved surface whether the effect of shielding for curvature is satisfactory or not. The practical performance of shielding material can be evaluated by observing various specimens different in the thickness and the radius of curvature using the bearing and the intensity of an applied magnetic field as a parameter. For a method of evaluation, electron beam holography (A. Tonomura, "Electron Holography", Springer Series in Optical Science, Vol. 70, (1993) Springer), Lorentz microscopic method (K. Harada et al., Nature Vol. 360, (1992)51), a shadow microscopic method (R. Aoki et al., Phys. Letters, Vol. 45-A (1973)89), where are already made practical are effective.

(2) Measuring Characteristic of Magnetic Recording Material Against Magnetic Field The system according to the invention is also effective in measuring the characteristic of magnetic recording material against a magnetic field. A record medium such as a magnetic tape is used for a specimen, the intensity and the bearing of a magnetic field applied to the specimen are gradually varied, observing the specimen, and the magnitude of a magnetic flux existing in the specimen and the variation are measured. In case a thin film to an extent that the transmission of a beam can be observed is installed in an electron microscope as a specimen, the distribution of inside magnetic flux can be observed and in the case of a thick specimen or a specimen having a predetermined shape, a local leakage flux can be observed by the similar arrangement to that in evaluating the performance of the shielding material. According to the method, as magnetic flux recording efficiency depending upon the crystallinity of recording material can be evaluated, it can be easily judged at which angle a magnetic flux of how much intensity is to be applied to a record medium. This is effective when distance and an angle between a magnetic head and a record medium are determined in a vertical magnetic recording apparatus. When an already recorded specimen is similarly observed, the resistance to an external magnetic field of record (recorded data is held against an external magnetic field of how much intensity and which bearing) can be evaluated.

(3) Observing the Variation of Magnetic Domain Structure

It is known that magnetic material has magnetic domain structure, however, the structure varies according to the intensity and the bearing of an external magnetic field. A state in which the magnetic domain structure responds to an external magnetic field is observed in the slow variation of a magnetic field or in the variation of a magnetic field synchronized with a frequency 60 Hz of a television image and a frequency for scanning an electron beam. According to the invention, as the variation of a magnetic field applied to a specimen and the selection of means required for observation are basically independent, a state of the variation of magnetic domain structure can be observed even if a magnetic field applied to the specimen is early varied. In principle, the variation of approximately $\frac{1}{400}$ second of magnetic domain structure can be also observed at the current technical level owing to the luminance of an electron beam and the speed of a recording meter. Generally, a floating magnetic field includes various frequency components and above all, an alternating current component of 50 Hz or 60 Hz has a large effect upon observation and processing using a charged particle beam, further, magnetic shielding and magnetic recording. In the system according to the invention, the characteristics of various material against such an A.C. magnetic field, particularly a magnetic property such as magnetic domain structure can be evaluated as in the case of direct current.

(4) Observing Fluxoid Quantum

For a method of observing and evaluating the magnetic domain structure, in case a superconductor is used for a specimen and is cooled up to superconductive transition temperature or lower, the dynamic observation and evaluation of a fluxoid quantum are possible as it is. The dynamic observation of an individual fluxoid quantum in the superconductor is still enabled by only Lorentz using an electron microscope at a television rate (1/30 second) and a state of a response of a fluxoid quantum to an A.C. magnetic field is not observed. The system according to the invention can also cool and is also effective in the dynamic observation of the superconductive fluxoid quantum.

(5) Observing Using Scanning Microscope Probe (Tip)

A probe (tip) of a scanning microscope represented by STM, above all, the tip is one of fine and important components that determines the performance of the microscope because the tip directly acts on a specimen and images its response. According to the system according to the invention, observation can be made at high magnification without destruction in an electron microscope by the tip and simultaneously, a response to a magnetic field can be observed and evaluated. Particularly, as magnetic material is used for the tip of a magnetic force microscope and the magnetic force of a magnetic flux leaked from the surface of a specimen is imaged, a state of the convergence of the lines of magnetic force at the tip can be effectively observed based upon a state of a response to an external magnetic field. In an SQUID microscope, a minute pickup coil is formed at the tip and magnetic flux that passes the coil is imaged. Magnetic properties acquired by the pickup coil and the tip can be observed by the system according to the invention.

According to the invention, the specimen observation system for applying an external magnetic field provided with the external magnetic field application system in which magnetic fields in all three-dimensional directions can be applied to a specimen to be observed or to be processed in an electron microscope or the system provided with the optical system using a charged particle beam and even if a magnetic field is applied in any direction, positional relation and the relation of an angle between the specimen and the charged particle beam remain unchanged can be provided.

What is claimed is:

1. A specimen observation system for applying an external magnetic field to the specimen, said specimen observing system comprising:

a source of a charged particle beam;

a condenser optical system for radiating said charged particle beam onto a specimen;

a specimen holder for holding the specimen to be observed on which the charged particle beam is radiated;

a system for applying magnetic fields to the specimen in three orthogonal directions having the optical axis of the condenser optical system as one of the three directions;

a front beam deflector disposed between the condenser optical system and the specimen holder for deflecting the charged particle beam away from the optical axis and then returning it to the optical axis such that the beam direction is in the direction of the optical axis when it illuminates the specimen; and a rear beam deflector disposed between the specimen holder and an imaging lens system, such that the deflector returns the charged particle beam to the optical axis after the beam passes through the magnetic fields applied to the specimen and such that the beam direction is in the direction of the optical axis, wherein the quantity and the direction of the deflection of the charged particle beam by the two beam deflectors are controlled according to the intensity and the direction of the magnetic fields applied to the specimen.

2. A specimen observation system for applying an external magnetic field according to claim 1, wherein:

the quantity and the direction of the deflection of the charged particle beam by the two beam deflectors are controlled by the control of magnetic fields perpendicular to the optical axis of the condenser optical system.

3. A specimen observation system for applying an external magnetic field according to claim 1, wherein:

each of the two beam deflectors is composed of coil pairs arranged at two stages in a direction of the optical axis and having two magnetic axes perpendicular to the optical axis of the condenser optical system.

4. A specimen observation system for applying an external magnetic field according to claim 3, wherein:

for each of the two beam deflectors, sub coils for finely controlling the intensity of a magnetic field by the coil pairs are added to one of the coil pairs having two perpendicular magnetic axes thereof.

5. A specimen observation system for applying an external magnetic field according to claim 1, wherein:

the two beam deflectors are formed using coil pairs, each coil of the coil pairs having a core made of magnetic material; and the external magnetic field application system is formed using air-core coils.

6. A specimen observation system for applying an external magnetic field according to claim 1, wherein:

the two beam deflectors are respectively formed by coil pairs connected in series so that magnetic fields generated on the optical axis of the condenser optical system are in reverse directions; and current is supplied from an independent power supply.

7. A specimen observation system for applying an external magnetic field according to claim 6, wherein:

for each of the two beam deflectors, sub coils for finely controlling the intensity of a magnetic field by the coil pairs are added to one of the coil pairs having two perpendicular magnetic axes thereof.

8. A specimen observation system for applying an external magnetic field according to claim 1, wherein:

the two beam deflectors provide an electric field acting on the charged particle beam.

9. An external magnetic field application system for applying an external magnetic field to a specimen in a specimen observation system, said system composed of:

a source of a charged particle beam;

a condenser optical system for radiating said charged particle beam from the source of the charged particle beam on a specimen;

a specimen holder for holding the specimen; and a system for applying magnetic fields to the specimen in three orthogonal directions having the optical axis of the condenser optical system as one axis to the specimen, comprising:

two air-core coils which are perpendicular to the optical axis and the magnetic axes of which are different by 90 degrees; and one air-core coil having the same magnetic axis as the optical axis, wherein current is independently supplied to each coil.

10. A specimen observation system for applying an external magnetic field according to claim 2, wherein:

each of the two beam deflectors is composed of coil pairs arranged at two stages in a direction of the optical axis and having two magnetic axes perpendicular to the optical axis of the condenser optical system.

11. A specimen observation system for applying an external magnetic field according to claim 2, wherein:

each of the two beam deflectors is composed of coil pairs, for each of the two beam deflectors, sub coils for finely controlling the intensity of a magnetic field by the coil pairs are added to one of the coil pairs having two perpendicular magnetic axes thereof.

12. A specimen observation system for applying an external magnetic field according to claim 2, wherein:

each of the two beam deflectors is composed of coil pairs, each coil of the pairs has a core made of magnetic material; and the external magnetic field application system is formed using air-core coils.

13. A specimen observation system for applying an external magnetic field according to claim 3, wherein:

each coil of the pairs has a core made of magnetic material; and the external magnetic field application system is formed using air-core coils.

14. A specimen observation system for applying an external magnetic field according to claim 11, wherein:

each coil of the pairs has a core made of magnetic material; and the external magnetic field application system is formed using air-core coils.

15. A specimen observation system for applying an external magnetic field according to claim 2, wherein:

the two beam deflectors are respectively formed by coil pairs connected in series so that magnetic fields generated on the optical axis of the condenser optical system are in reverse directions; and current is supplied from an independent power supply.

16. A specimen observation system for applying an external magnetic field according to claim 3, wherein:

the two beam deflectors are respectively formed by the coil pairs connected in series so that magnetic fields generated on the optical axis of the condenser optical system are in reverse directions; and current is supplied from an independent power supply.

17. A specimen observation system for applying an external magnetic field according to claim 11, wherein:

the two beam deflectors are respectively formed by the coil pairs connected in series so that magnetic fields generated on the optical axis of the condenser optical system are in reverse directions; and current is supplied from an independent power supply.

18. A specimen observation system for applying an external magnetic field according to claim 15, wherein:

each of the two beam deflectors is composed of coil pairs, for each of the two beam deflectors, sub coils for finely controlling the intensity of a magnetic field by the coil pairs are added to one of the coil pairs having two perpendicular magnetic axes thereof.

19. A specimen observation system for applying an external magnetic field according to claim 16, wherein:

for each of the two beam deflectors, sub coils for finely controlling the intensity of a magnetic field by the coil pairs are added to one of the coil pairs having two perpendicular magnetic axes thereof.

20. A specimen observation system for applying an external magnetic field according to claim 10, wherein:

for each of the two beam deflectors, sub coils for finely controlling the intensity of a magnetic field by the coil pairs are added to one of the coil pairs having two perpendicular magnetic axes thereof.

21. A specimen observation system for applying an external magnetic field according to claim 5, wherein:

the two beam deflectors are respectively formed by the coil pairs connected in series so that the magnetic fields generated on the optical axis of the condenser optical system are in reverse directions, and current is supplied from an independent power supply.

22. A specimen observation system for applying an external magnetic field according to claim 12, wherein:

the two beam deflectors are respectively formed by the coil pairs connected in series so that magnetic fields generated on the optical axis of the condenser optical system are in reverse directions, and current is supplied from an independent power supply.

23. A specimen observation system for applying an external magnetic field according to claim 14, wherein:

the two beam deflectors are respectively formed by the coil pairs connected in series so that magnetic fields generated on the optical axis of the condenser optical system are in reverse directions, and current is supplied from an independent power supply.

24. A specimen observation system for applying an external magnetic field according to claim 21, wherein:

for each of the two beam deflectors, sub coils for finely controlling the intensity of a magnetic field by the coil pairs are added to one of the coil pairs having two perpendicular magnetic axes thereof.

25. A specimen observation system for applying an external magnetic field according to claim 22, wherein:

for each of the two beam deflectors, sub coils for finely controlling the intensity of a magnetic field by the coil pairs are added to one of the coil pairs having two perpendicular magnetic axes thereof.

* * * * *